(12) United States Patent
Vitale et al.

(10) Patent No.: US 12,407,908 B2
(45) Date of Patent: Sep. 2, 2025

(54) HEATSINK OF AN IMAGE CAPTURE DEVICE

(71) Applicant: GoPro, Inc., San Mateo, CA (US)

(72) Inventors: Nicholas Vitale, Foster City, CA (US); Raul Vargas Gonzalez, Redwood City, CA (US); Herman Wong, Millbrae, CA (US)

(73) Assignee: GoPro, Inc., San Mateo, CA (US)

( * ) Notice: Subject to any disclaimer, the term of this patent is extended or adjusted under 35 U.S.C. 154(b) by 0 days.

(21) Appl. No.: 18/210,817

(22) Filed: Jun. 16, 2023

(65) Prior Publication Data

US 2023/0328345 A1    Oct. 12, 2023

Related U.S. Application Data

(63) Continuation of application No. 17/378,992, filed on Jul. 19, 2021, now Pat. No. 11,689,790, which is a
(Continued)

(51) Int. Cl.
*H04N 23/51* (2023.01)
*G03B 17/12* (2021.01)
(Continued)

(52) U.S. Cl.
CPC .............. *H04N 23/51* (2023.01); *G03B 17/12* (2013.01); *G03B 17/561* (2013.01); *H04N 23/54* (2023.01);
(Continued)

(58) Field of Classification Search
None
See application file for complete search history.

(56) References Cited

U.S. PATENT DOCUMENTS

| 5,471,027 A | 11/1995 | Call |
| 6,097,598 A | 8/2000 | Miyahara |

(Continued)

FOREIGN PATENT DOCUMENTS

| CN | 110235059 A | 9/2019 |
| JP | 2004020798 A | 1/2004 |

(Continued)

OTHER PUBLICATIONS

International Preliminary Report on Patentability issued in App. No. PCT/US2021/019970, mailing date Sep. 9, 2022, 6 pages.

(Continued)

*Primary Examiner* — Twyler L Haskins
*Assistant Examiner* — Wesley J Chiu
(74) *Attorney, Agent, or Firm* — Young Basile Hanlon & MacFarlane, P.C.

(57) ABSTRACT

An image capture device having a housing and a heatsink. The image capture device includes an integrated sensor and lens assembly. The heatsink is located partially or completely within the housing. The heatsink includes a through which a portion of the integrated sensor and lens assembly extends, and a planar surface located adjacent to the cutout. The planar surface includes a front side and a rear side. A printed circuit board in communication with a rear side of the planar surface of the heatsink. An LCD recess located in a front side of the planar surface of the heatsink that is configured to receive a liquid crystal display, wherein the LCD recess is opposite the printed circuit board.

20 Claims, 12 Drawing Sheets

Related U.S. Application Data continuation-in-part of application No. 16/803,139, filed on Feb. 27, 2020, now Pat. No. 11,277,545.

(51) Int. Cl.

| | | |
|---|---|---|
| *G03B 17/56* | (2021.01) | |
| *H04N 23/54* | (2023.01) | |
| *H04N 23/57* | (2023.01) | |
| *H05K 1/02* | (2006.01) | |
| *H05K 1/18* | (2006.01) | |
| *G03B 17/55* | (2021.01) | |

(52) U.S. Cl.
CPC ............ *H04N 23/57* (2023.01); *H05K 1/021* (2013.01); *H05K 1/18* (2013.01); *G03B 17/55* (2013.01)

(56) References Cited

U.S. PATENT DOCUMENTS

| | | |
|---|---|---|
| 7,329,869 B2 | 2/2008 | Cassel |
| 9,025,080 B2 | 5/2015 | Samuels |
| 9,860,970 B2 | 1/2018 | Tolbert |
| 9,910,342 B2 | 3/2018 | Samuels |
| 10,613,420 B2 | 4/2020 | Ali |
| 10,656,689 B2 | 5/2020 | Kilgore |
| 10,701,249 B1 | 6/2020 | Guo |
| 11,146,711 B1 | 10/2021 | Crow |
| 11,277,545 B2 | 3/2022 | Crow |
| 11,637,949 B2 | 4/2023 | Crow |
| 2003/0128536 A1 | 7/2003 | Radu |
| 2003/0202328 A1 | 10/2003 | Deeney |
| 2004/0169771 A1 | 9/2004 | Washington |
| 2006/0100336 A1 | 5/2006 | Fukui |
| 2008/0056695 A1 | 3/2008 | Huang |
| 2008/0205881 A1 | 8/2008 | Sakurai |
| 2009/0274953 A1 | 11/2009 | Myers |
| 2010/0296805 A1 | 11/2010 | Mayer |
| 2011/0127912 A1 | 6/2011 | Lee |
| 2011/0194009 A1* | 8/2011 | Park ........................ H04N 23/54 348/E5.022 |
| 2012/0035418 A1 | 2/2012 | Talbert |
| 2014/0055671 A1* | 2/2014 | Kawamura ............... H04N 5/64 348/374 |
| 2014/0104479 A1 | 4/2014 | Samuels |
| 2014/0160284 A1 | 6/2014 | Achenbach |
| 2015/0049243 A1 | 2/2015 | Samuels |
| 2015/0365569 A1 | 12/2015 | Mai |
| 2016/0174408 A1 | 6/2016 | Tolbert |
| 2016/0334692 A1 | 11/2016 | Samuels |
| 2016/0349601 A1* | 12/2016 | Kungl ................... G03B 17/14 |
| 2016/0374190 A1 | 12/2016 | Tolbert |
| 2017/0070652 A1 | 3/2017 | Müller |
| 2017/0156205 A1 | 6/2017 | Liu |
| 2017/0195531 A1 | 7/2017 | Warren |
| 2017/0195533 A1 | 7/2017 | Seo |
| 2017/0200992 A1 | 7/2017 | Piggott |
| 2017/0294694 A1 | 10/2017 | Tso |
| 2018/0107099 A1 | 4/2018 | Yasuda |
| 2018/0259831 A1 | 9/2018 | Chiu |
| 2019/0041600 A1 | 2/2019 | Sakamoto |
| 2019/0056643 A1 | 2/2019 | Chang |
| 2019/0163037 A1 | 5/2019 | Takashi |
| 2019/0346126 A1 | 11/2019 | Wada |
| 2020/0033774 A1 | 1/2020 | Shinji |
| 2020/0064533 A1 | 2/2020 | Miyazaki |
| 2020/0344395 A1* | 10/2020 | Guo ................... H05K 7/20309 |
| 2020/0413567 A1 | 12/2020 | Chusseau |
| 2021/0033815 A1 | 2/2021 | Lin |
| 2021/0122299 A1 | 4/2021 | Garcia |
| 2021/0272879 A1* | 9/2021 | Kubo ................... H01L 23/3733 |
| 2021/0274067 A1 | 9/2021 | Crow |
| 2021/0306536 A1 | 9/2021 | Vitale |
| 2021/0321027 A1 | 10/2021 | Crow |
| 2021/0344819 A1 | 11/2021 | Vitale |
| 2022/0021795 A1 | 1/2022 | Crow |
| 2022/0124226 A1 | 4/2022 | Jeong |
| 2022/0159148 A1 | 5/2022 | Crow |
| 2023/0009451 A1 | 1/2023 | Connolly |
| 2024/0073499 A1 | 2/2024 | Vitale |
| 2024/0073500 A1 | 2/2024 | Vitale |
| 2024/0073506 A1 | 2/2024 | Vitale |

FOREIGN PATENT DOCUMENTS

| | | |
|---|---|---|
| JP | 2006086752 A | 3/2006 |
| JP | 2008015476 A | 1/2008 |
| JP | 2009278584 A | 11/2009 |
| JP | 5322866 B2 | 10/2013 |
| JP | 2017073634 A | 4/2017 |

OTHER PUBLICATIONS

International Preliminary Report on Patentability issued in App. No. PCT/US2021/026140, mailing date Oct. 20, 2022, 8 pages.
International Search Report and Written Opinion for App. No. PCT/US2021/019970, dated Jun. 3, 2021, 9 pages.
International Search Report and Written Opinion for App. No. PCT/US2021/026140, dated Jul. 1, 2021, 10 pages.
U.S. Appl. No. 16/803,139, filed Feb. 27, 2020, Crow et al.

* cited by examiner

HEATSINK OF AN IMAGE CAPTURE DEVICE

CROSS-REFERENCE TO RELATED APPLICATION(S)

This application is a continuation of U.S. patent application Ser. No. 17/378,992, filed on Jul. 19, 2021, which is a continuation in part of U.S. patent application Ser. No. 16/803,139, filed on Feb. 27, 2020, now U.S. Pat. No. 11,277,545, the entire disclosures of which are hereby incorporated by reference.

TECHNICAL FIELD

This disclosure relates to a heatsink in an image capture device and specifically a heatsink for an image capture device.

BACKGROUND

Photography during physical activity has been improved by use of simple-to-operate, lightweight, compact cameras or imaging devices. Advancements in technology have allowed for more functionality to be added to the cameras. Faster components have been added to the cameras, allowing for clearer images to be taken by the cameras. Additionally, the cameras have been sealed so that the cameras may be splashed, submerged, or otherwise inundated with water. These improvements have caused an increase in thermal loads within the camera.

SUMMARY

Disclosed herein are implementations of a heatsink for an image capture device.

The present teachings provide an image capture device comprising a housing, a heatsink, a printed circuit board, and a sheet conductor. The heatsink is located partially or completely within the housing, wherein the heatsink comprises a planar surface. The printed circuit board is in communication with the heatsink. The sheet conductor is a graphite sheet connected to the planar surface of the heatsink and in direct contact with the printed circuit board or components of the printed circuit board.

The present teachings provide an image capture device comprising: a heatsink and a sheet conductor. The heatsink comprises a planar surface and a cut out that are adjacent. The sheet conductor covers a portion of the planar surface of the heatsink. The sheet conductor has a thickness that is less than the thickness of the heatsink and the sheet conductor is made of a material that has a higher thermal conductivity than the material of the heatsink.

The present teachings provide an image capture device comprising a housing, a heatsink, a printed circuit board, a sheet conductor, and a connector. The heatsink is located partially or completely within the housing, wherein the heatsink comprises a planar surface. The printed circuit board is in communication with the heatsink. The sheet conductor is located between and in direct contact with the planar surface of the heatsink and the printed circuit board. The connector connects the sheet conductor to the heatsink.

An image capture device having a housing and a heatsink. The image capture device includes an integrated sensor and lens assembly. The heatsink is located partially or completely within the housing. The heatsink includes a through which a portion of the integrated sensor and lens assembly extends, and a planar surface located adjacent to the cutout. The planar surface includes a front side and a rear side. A printed circuit board in communication with a rear side of the planar surface of the heatsink. An LCD recess located in a front side of the planar surface of the heatsink that is configured to receive a liquid crystal display, wherein the LCD recess is opposite the printed circuit board.

The present teachings provide: an image capture device including: an integrated sensor and lens assembly and a heatsink. The heatsink includes a planar surface and a cutout. The planar surface includes a first side facing external to the image capture device and a second side facing internal to the image capture device. The cutout is adjacent to the planar surface, wherein a portion of the integrated sensor and lens assembly is located on a first side of the heatsink, the integrated sensor and lens assembly extends through the cutout, and a portion of the integrated sensor and lens assembly is located on a second side of the heatsink. The heatsink includes bosses configured to receive fasteners that form a connection with the heatsink; and an LCD recess, on the first side of the planar surface, that is configured to connect to a liquid crystal display (LCD) of the image capture device. A printed circuit board in communication with a second side of the planar surface.

The present teachings provide: an image capture device including a housing, a heatsink, a thermal interface material, and a printed circuit board. The heatsink located partially or completely within the housing. The heatsink includes: a planar surface, a cutout, a first mounting flange connected to a first edge of the heatsink, and a finger mounting flange connected to a second edge of the heatsink with the planar surface extending between the first mounting flange and the finger mounting flange. The printed circuit board in communication with the planar surface of the heatsink via the thermal interface material.

Additional teachings are described in further detail below.

BRIEF DESCRIPTION OF THE DRAWINGS

The disclosure is best understood from the following detailed description when read in conjunction with the accompanying drawings. It is emphasized that, according to common practice, the various features of the drawings are not to-scale. On the contrary, the dimensions of the various features are arbitrarily expanded or reduced for clarity.

DETAILED DESCRIPTION

As more components and processing power are added to image capture devices, more heat is added to image capture devices. Improved thermal management in an image capture device becomes important to provide for extended use of the image capture device. Management of heat with and along a heatsink may allow for extended use of the image capture device before the heat retained within the image capture device impacts operation or before components become potentially damaged. The heatsink may have a hole that an (ISLA) extends through, where the ISLA is free of contact with the heatsink. The heatsink may support a battery and/or a battery cage, may support a sensor, circuit board, or other component in a GPS, or may include a combination of the described components. The present disclosure relates to heatsinks in image capture devices such as heatsinks that are free of communication with an ISLA, create a space between a housing and components of a GPS, support a battery cage, or include a combination of these components.

Figure 1A:
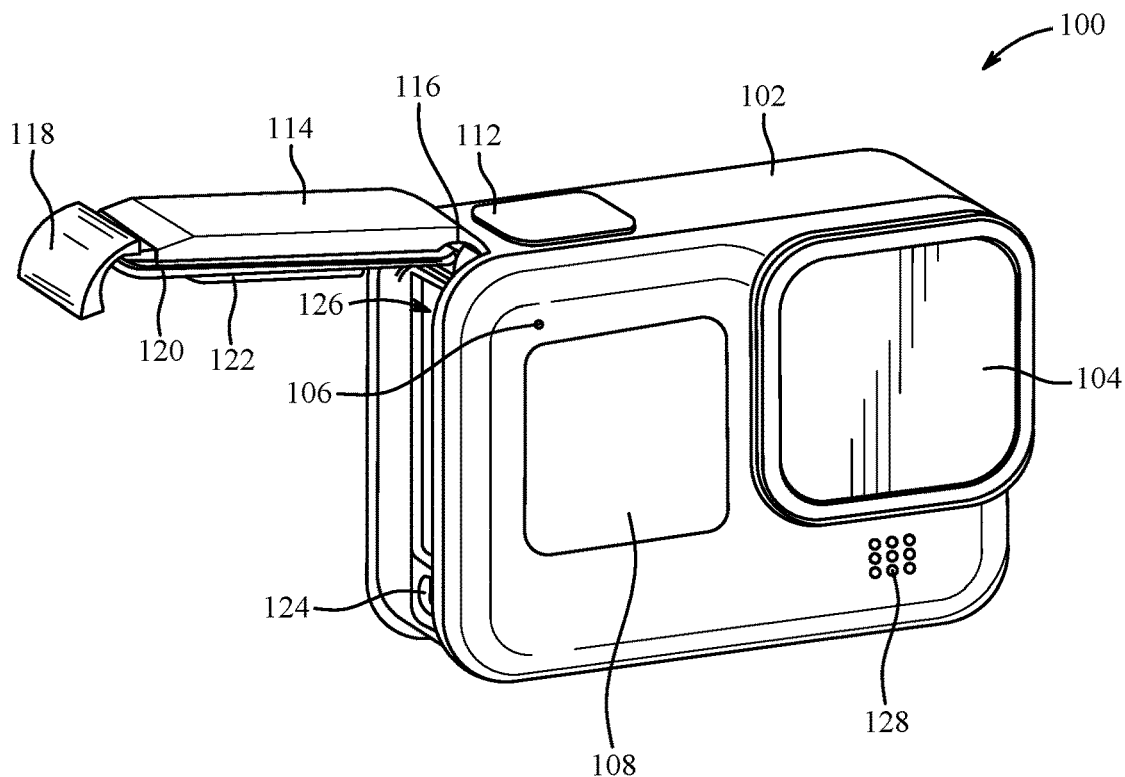
FIGS. 1A-B are isometric views of an example of an image capture device.
Figure 1B:
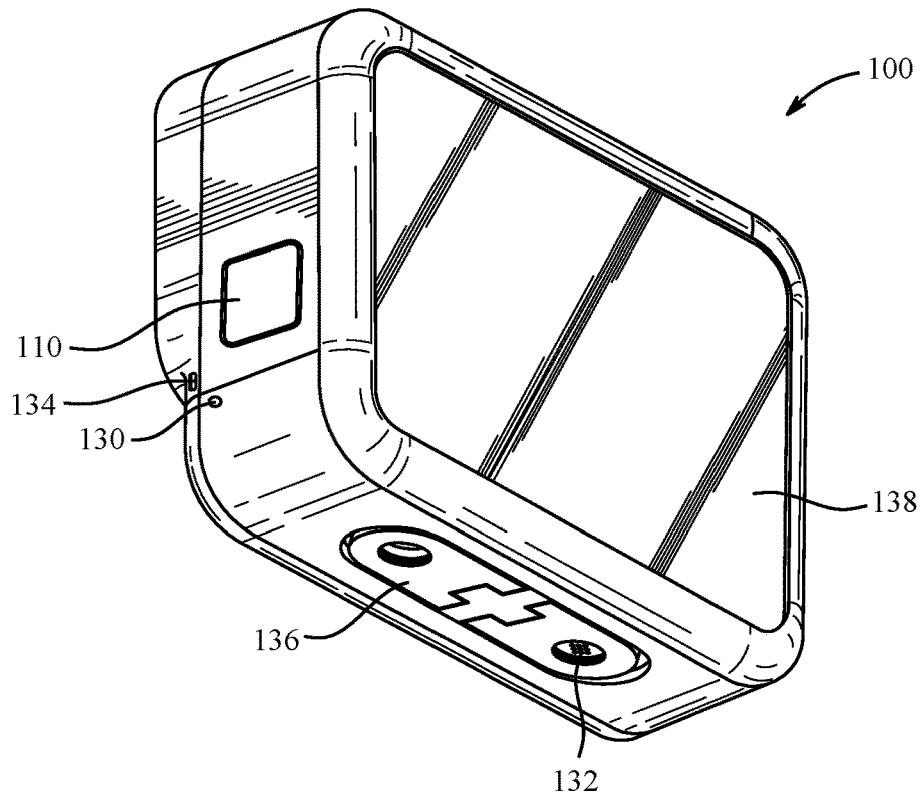

FIGS. 1A-B are isometric views of an example of an image capture device 100. The image capture device 100 may include a body 102, a lens 104 structured on a front surface of the body 102, various indicators on the front surface of the body 102 (such as light-emitting diodes (LEDs), displays, and the like), various input mechanisms (such as buttons, switches, and/or touch-screens), and electronics (such as imaging electronics, power electronics, etc.) internal to the body 102 for capturing images via the lens 104 and/or performing other functions. The lens 104 is configured to receive light incident upon the lens 104 and to direct received light onto an image sensor internal to the body 102. The image capture device 100 may be configured to capture images and video and to store captured images and video for subsequent display or playback.

The image capture device 100 may include an LED or another form of indicator 106 to indicate a status of the image capture device 100 and a liquid-crystal display (LCD) or other form of a display 108 to show status information such as battery life, camera mode, elapsed time, and the like. The image capture device 100 may also include a mode button 110 and a shutter button 112 that are configured to allow a user of the image capture device 100 to interact with the image capture device 100. For example, the mode button 110 and the shutter button 112 may be used to turn the image capture device 100 on and off, scroll through modes and settings, and select modes and change settings. The image capture device 100 may include additional buttons or interfaces (not shown) to support and/or control additional functionality.

The image capture device 100 may include a door 114 coupled to the body 102, for example, using a hinge mechanism 116. The door 114 may be secured to the body 102 using a latch mechanism 118 that releasably engages the body 102 at a position generally opposite the hinge mechanism 116. The door 114 may also include a seal 120 and a battery interface 122. When the door 114 is an open position, access is provided to an input-output (I/O) interface 124 for connecting to or communicating with external devices as described below and to a battery receptacle 126 for placement and replacement of a battery (not shown). The battery receptacle 126 includes operative connections (not shown) for power transfer between the battery and the image capture device 100. When the door 114 is in a closed position, the seal 120 engages a flange (not shown) or other interface to provide an environmental seal, and the battery interface 122 engages the battery to secure the battery in the battery receptacle 126. The door 114 can also have a removed position (not shown) where the entire door 114 is separated from the image capture device 100, that is, where both the hinge mechanism 116 and the latch mechanism 118 are decoupled from the body 102 to allow the door 114 to be removed from the image capture device 100.

The image capture device 100 may include a microphone 128 on a front surface and another microphone 130 on a side surface. The image capture device 100 may include other microphones on other surfaces (not shown). The microphones 128, 130 may be configured to receive and record audio signals in conjunction with recording video or separate from recording of video. The image capture device 100 may include a speaker 132 on a bottom surface of the image capture device 100. The image capture device 100 may include other speakers on other surfaces (not shown). The speaker 132 may be configured to play back recorded audio or emit sounds associated with notifications.

A front surface of the image capture device 100 may include a drainage channel 134. A bottom surface of the image capture device 100 may include an interconnect mechanism 136 for connecting the image capture device 100 to a handle grip or other securing device. In the example shown in FIG. 1B, the interconnect mechanism 136 includes folding protrusions configured to move between a nested or collapsed position as shown and an extended or open position (not shown) that facilitates coupling of the protrusions to mating protrusions of other devices such as handle grips, mounts, clips, or like devices.

The image capture device 100 may include an interactive display 138 that allows for interaction with the image capture device 100 while simultaneously displaying information on a surface of the image capture device 100.

The image capture device 100 of FIGS. 1A-B includes an exterior that encompasses and protects internal electronics. In the present example, the exterior includes six surfaces (i.e. a front face, a left face, a right face, a back face, a top face, and a bottom face) that form a rectangular cuboid. Furthermore, both the front and rear surfaces of the image capture device 100 are rectangular. In other embodiments, the exterior may have a different shape. The image capture device 100 may be made of a rigid material such as plastic, aluminum, steel, or fiberglass. The image capture device 100 may include features other than those described here. For example, the image capture device 100 may include additional buttons or different interface features, such as interchangeable lenses, cold shoes, and hot shoes that can add functional features to the image capture device 100.

The image capture device 100 may include various types of image sensors, such as charge-coupled device (CCD) sensors, active pixel sensors (APS), complementary metal-oxide-semiconductor (CMOS) sensors, N-type metal-oxide-semiconductor (NMOS) sensors, and/or any other image sensor or combination of image sensors.

Although not illustrated, in various embodiments, the image capture device 100 may include other additional electrical components (e.g., an image processor, camera system-on-chip (SoC), etc.), which may be included on one or more circuit boards within the body 102 of the image capture device 100.

The image capture device 100 may interface with or communicate with an external device, such as an external user interface device (not shown), via a wired or wireless computing communication link (e.g., the I/O interface 124). Any number of computing communication links may be used. The computing communication link may be a direct computing communication link or an indirect computing communication link, such as a link including another device or a network, such as the internet, may be used.

In some implementations, the computing communication link may be a Wi-Fi link, an infrared link, a Bluetooth (BT) link, a cellular link, a ZigBee link, a near field communications (NFC) link, such as an ISO/IEC 20643 protocol link, an Advanced Network Technology interoperability (ANT+) link, and/or any other wireless communications link or combination of links.

In some implementations, the computing communication link may be an HDMI link, a USB link, a digital video interface link, a display port interface link, such as a Video Electronics Standards Association (VESA) digital display interface link, an Ethernet link, a Thunderbolt link, and/or other wired computing communication link.

The image capture device 100 may transmit images, such as panoramic images, or portions thereof, to the external user interface device via the computing communication link, and the external user interface device may store, process, display, or a combination thereof the panoramic images.

The external user interface device may be a computing device, such as a smartphone, a tablet computer, a phablet, a smart watch, a portable computer, personal computing device, and/or another device or combination of devices configured to receive user input, communicate information with the image capture device 100 via the computing communication link, or receive user input and communicate information with the image capture device 100 via the computing communication link.

The external user interface device may display, or otherwise present, content, such as images or video, acquired by the image capture device 100. For example, a display of the external user interface device may be a viewport into the three-dimensional space represented by the panoramic images or video captured or created by the image capture device 100.

The external user interface device may communicate information, such as metadata, to the image capture device 100. For example, the external user interface device may send orientation information of the external user interface device with respect to a defined coordinate system to the image capture device 100, such that the image capture device 100 may determine an orientation of the external user interface device relative to the image capture device 100.

Based on the determined orientation, the image capture device 100 may identify a portion of the panoramic images or video captured by the image capture device 100 for the image capture device 100 to send to the external user interface device for presentation as the viewport. In some implementations, based on the determined orientation, the image capture device 100 may determine the location of the external user interface device and/or the dimensions for viewing of a portion of the panoramic images or video.

The external user interface device may implement or execute one or more applications to manage or control the image capture device 100. For example, the external user interface device may include an application for controlling camera configuration, video acquisition, video display, or any other configurable or controllable aspect of the image capture device 100.

The user interface device, such as via an application, may generate and share, such as via a cloud-based or social media service, one or more images, or short video clips, such as in response to user input. In some implementations, the external user interface device, such as via an application, may remotely control the image capture device 100 such as in response to user input.

The external user interface device, such as via an application, may display unprocessed or minimally processed images or video captured by the image capture device 100 contemporaneously with capturing the images or video by the image capture device 100, such as for shot framing or live preview, and which may be performed in response to user input. In some implementations, the external user interface device, such as via an application, may mark one or more key moments contemporaneously with capturing the images or video by the image capture device 100, such as with a tag or highlight in response to a user input or user gesture.

The external user interface device, such as via an application, may display or otherwise present marks or tags associated with images or video, such as in response to user input. For example, marks may be presented in a camera roll application for location review and/or playback of video highlights.

The external user interface device, such as via an application, may wirelessly control camera software, hardware, or both. For example, the external user interface device may include a web-based graphical interface accessible by a user for selecting a live or previously recorded video stream from the image capture device 100 for display on the external user interface device.

The external user interface device may receive information indicating a user setting, such as an image resolution setting (e.g., 3840 pixels by 2160 pixels), a frame rate setting (e.g., 60 frames per second (fps)), a location setting, and/or a context setting, which may indicate an activity, such as mountain biking, in response to user input, and may communicate the settings, or related information, to the image capture device 100.

Figure 2A:
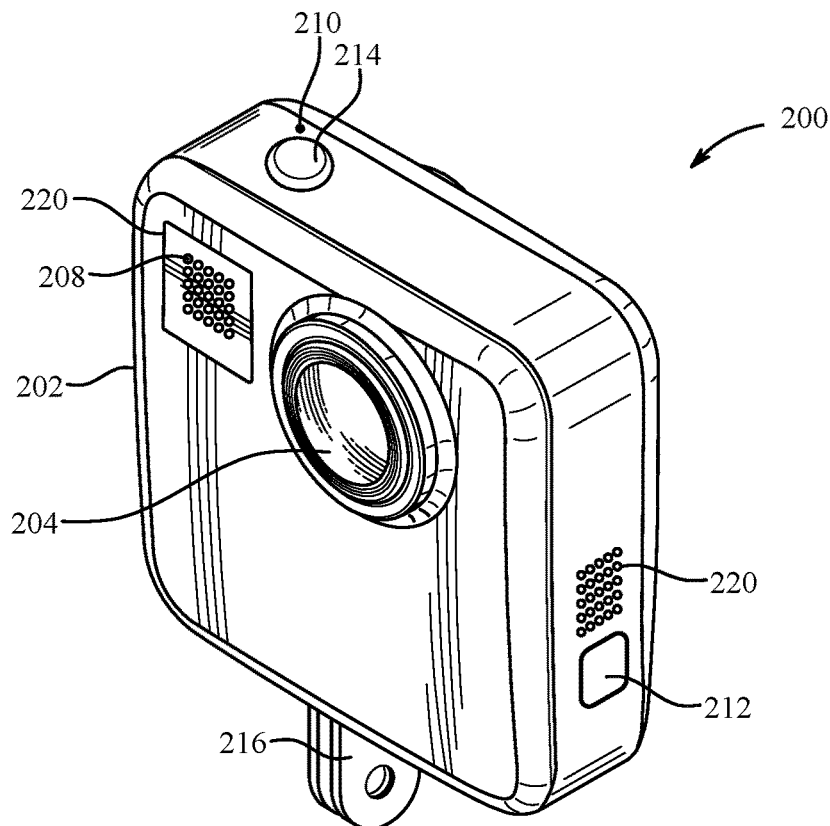
FIGS. 2A-B are isometric views of another example of an image capture device.
Figure 2B:
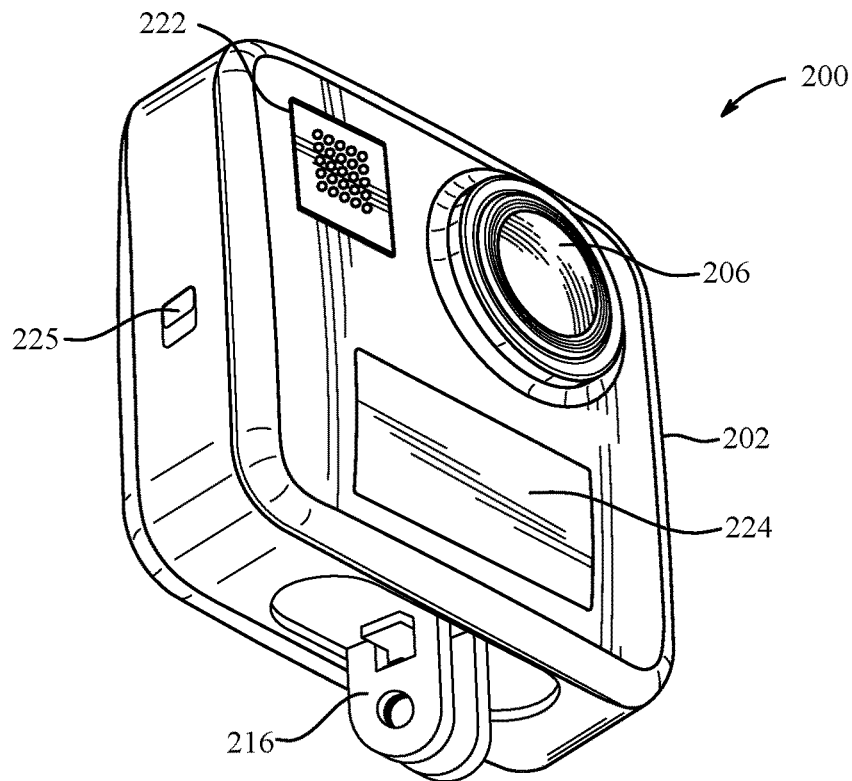

FIGS. 2A-B illustrate another example of an image capture device 200. The image capture device 200 includes a body 202 and two camera lenses 204 and 206 disposed on opposing surfaces of the body 202, for example, in a back-to-back configuration, Janus configuration, or offset Janus configuration. The body 202 of the image capture device 200 may be made of a rigid material such as plastic, aluminum, steel, or fiberglass.

The image capture device 200 includes various indicators on the front of the surface of the body 202 (such as LEDs, displays, and the like), various input mechanisms (such as buttons, switches, and touch-screen mechanisms), and electronics (e.g., imaging electronics, power electronics, etc.)

internal to the body 202 that are configured to support image capture via the two camera lenses 204 and 206 and/or perform other imaging functions.

The image capture device 200 includes various indicators, for example, LEDs 208, 210 to indicate a status of the image capture device 100. The image capture device 200 may include a mode button 212 and a shutter button 214 configured to allow a user of the image capture device 200 to interact with the image capture device 200, to turn the image capture device 200 on, and to otherwise configure the operating mode of the image capture device 200. It should be appreciated, however, that, in alternate embodiments, the image capture device 200 may include additional buttons or inputs to support and/or control additional functionality.

The image capture device 200 may include an interconnect mechanism 216 for connecting the image capture device 200 to a handle grip or other securing device. In the example shown in FIGS. 2A and 2B, the interconnect mechanism 216 includes folding protrusions configured to move between a nested or collapsed position (not shown) and an extended or open position as shown that facilitates coupling of the protrusions to mating protrusions of other devices such as handle grips, mounts, clips, or like devices.

The image capture device 200 may include audio components 218, 220, 222 such as microphones configured to receive and record audio signals (e.g., voice or other audio commands) in conjunction with recording video. The audio component 218, 220, 222 can also be configured to play back audio signals or provide notifications or alerts, for example, using speakers. Placement of the audio components 218, 220, 222 may be on one or more of several surfaces of the image capture device 200. In the example of FIGS. 2A and 2B, the image capture device 200 includes three audio components 218, 220, 222, with the audio component 218 on a front surface, the audio component 220 on a side surface, and the audio component 222 on a back surface of the image capture device 200. Other numbers and configurations for the audio components are also possible.

The image capture device 200 may include an interactive display 224 that allows for interaction with the image capture device 200 while simultaneously displaying information on a surface of the image capture device 200. The interactive display 224 may include an I/O interface, receive touch inputs, display image information during video capture, and/or provide status information to a user. The status information provided by the interactive display 224 may include battery power level, memory card capacity, time elapsed for a recorded video, etc.

The image capture device 200 may include a release mechanism 225 that receives a user input to in order to change a position of a door (not shown) of the image capture device 200. The release mechanism 225 may be used to open the door (not shown) in order to access a battery, a battery receptacle, an I/O interface, a memory card interface, etc. (not shown) that are similar to components described in respect to the image capture device 100 of FIGS. 1A and 1B.

In some embodiments, the image capture device 200 described herein includes features other than those described. For example, instead of the I/O interface and the interactive display 224, the image capture device 200 may include additional interfaces or different interface features. For example, the image capture device 200 may include additional buttons or different interface features, such as interchangeable lenses, cold shoes, and hot shoes that can add functional features to the image capture device 200.

Figure 3:
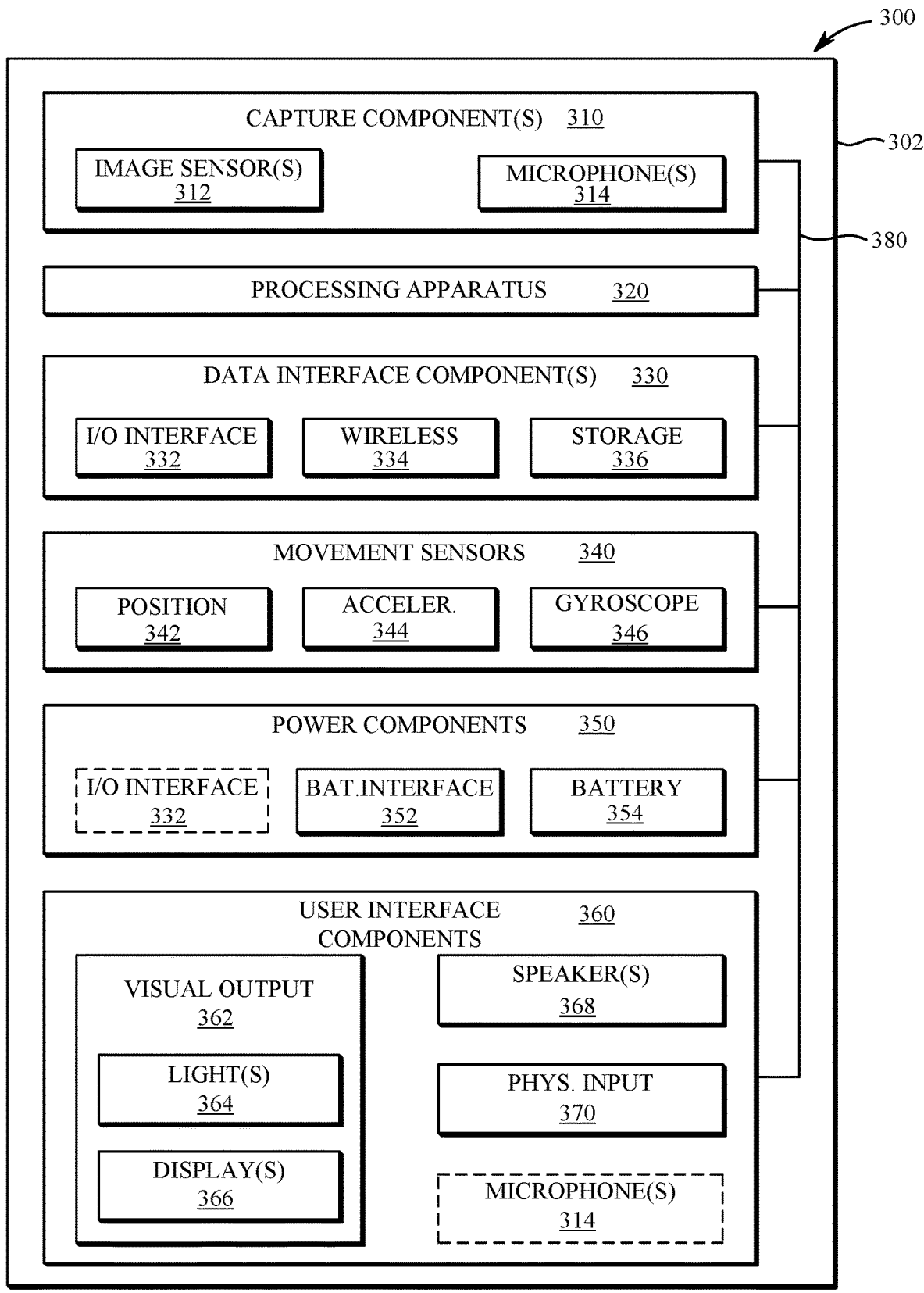
FIG. 3 is a block diagram of electronic components of an image capture device.

FIG. 3 is a block diagram of electronic components in an image capture device 300. The image capture device 300 may be a single-lens image capture device, a multi-lens image capture device, or variations thereof, including an image capture device with multiple capabilities such as use of interchangeable ISLA. The description of the image capture device 300 is also applicable to the image capture devices 100, 200 of FIGS. 1A-B and 2A-B.

The image capture device 300 includes a body 302 which includes electronic components such as capture components 310, a processing apparatus 320, data interface components 330, movement sensors 340, power components 350, and/or user interface components 360.

The capture components 310 include one or more image sensors 312 for capturing images and one or more microphones 314 for capturing audio.

The image sensor(s) 312 is configured to detect light of a certain spectrum (e.g., the visible spectrum or the infrared spectrum) and convey information constituting an image as electrical signals (e.g., analog or digital signals). The image sensor(s) 312 detects light incident through a lens coupled or connected to the body 302. The image sensor(s) 312 may be any suitable type of image sensor, such as a charge-coupled device (CCD) sensor, active pixel sensor (APS), complementary metal-oxide-semiconductor (CMOS) sensor, N-type metal-oxide-semiconductor (NMOS) sensor, and/or any other image sensor or combination of image sensors. Image signals from the image sensor(s) 312 may be passed to other electronic components of the image capture device 300 via a bus 380, such as to the processing apparatus 320. In some implementations, the image sensor(s) 312 includes a digital-to-analog converter. A multi-lens variation of the image capture device 300 can include multiple image sensors 312.

The microphone(s) 314 is configured to detect sound, which may be recorded in conjunction with capturing images to form a video. The microphone(s) 314 may also detect sound in order to receive audible commands to control the image capture device 300.

The processing apparatus 320 may be configured to perform image signal processing (e.g., filtering, tone mapping, stitching, and/or encoding) to generate output images based on image data from the image sensor(s) 312. The processing apparatus 320 may include one or more processors having single or multiple processing cores. In some implementations, the processing apparatus 320 may include an application specific integrated circuit (ASIC). For example, the processing apparatus 320 may include a custom image signal processor. The processing apparatus 320 may exchange data (e.g., image data) with other components of the image capture device 300, such as the image sensor(s) 312, via the bus 380.

The processing apparatus 320 may include memory, such as a random-access memory (RAM) device, flash memory, or another suitable type of storage device, such as a non-transitory computer-readable memory. The memory of the processing apparatus 320 may include executable instructions and data that can be accessed by one or more processors of the processing apparatus 320. For example, the processing apparatus 320 may include one or more dynamic random-access memory (DRAM) modules, such as double data rate synchronous dynamic random-access memory (DDR SDRAM). In some implementations, the processing apparatus 320 may include a digital signal processor (DSP). More than one processing apparatus may also be present or associated with the image capture device 300.

The data interface components 330 enable communication between the image capture device 300 and other electronic devices, such as a remote control, a smartphone, a tablet computer, a laptop computer, a desktop computer, or a storage device. For example, the data interface components 330 may be used to receive commands to operate the image capture device 300, transfer image data to other electronic devices, and/or transfer other signals or information to and from the image capture device 300. The data interface components 330 may be configured for wired and/or wireless communication. For example, the data interface components 330 may include an I/O interface 332 that provides wired communication for the image capture device, which may be a USB interface (e.g., USB type-C), a high-definition multimedia interface (HDMI), or a FireWire interface. The data interface components 330 may include a wireless data interface 334 that provides wireless communication for the image capture device 300, such as a Bluetooth interface, a ZigBee interface, and/or a Wi-Fi interface. The data interface components 330 may include a storage interface 336, such as a memory card slot configured to receive and operatively couple to a storage device (e.g., a memory card) for data transfer with the image capture device 300 (e.g., for storing captured images and/or recorded audio and video).

The movement sensors 340 may detect the position and movement of the image capture device 300. The movement sensors 340 may include a position sensor 342, an accelerometer 344, or a gyroscope 346. The position sensor 342, such as a GPS sensor, is used to determine a position of the image capture device 300. The accelerometer 344, such as a three-axis accelerometer, measures linear motion (e.g., linear acceleration) of the image capture device 300. The gyroscope 346, such as a three-axis gyroscope, measures rotational motion (e.g., rate of rotation) of the image capture device 300. Other types of movement sensors 340 may also be present or associated with the image capture device 300.

The power components 350 may receive, store, and/or provide power for operating the image capture device 300. The power components 350 may include a battery interface 352 and a battery 354. The battery interface 352 operatively couples to the battery 354, for example, with conductive contacts to transfer power from the battery 354 to the other electronic components of the image capture device 300. The power components 350 may also include the I/O interface 332, as indicated in dotted line, and the power components 350 may receive power from an external source, such as a wall plug or external battery, for operating the image capture device 300 and/or charging the battery 354 of the image capture device 300.

The user interface components 360 may allow the user to interact with the image capture device 300, for example, providing outputs to the user and receiving inputs from the user. The user interface components 360 may include visual output components 362 to visually communicate information and/or present captured images to the user. The visual output components 362 may include one or more lights 364 and/or more displays 366. The display(s) 366 may be configured as a touch screen that receives inputs from the user. The user interface components 360 may also include one or more speakers 368. The speaker(s) 368 can function as an audio output component that audibly communicates information and/or presents recorded audio to the user. The user interface components 360 may also include one or more physical input interfaces 370 that are physically manipulated by the user to provide input to the image capture device 300. The physical input interfaces 370 may, for example, be configured as buttons, toggles, or switches. The user interface components 360 may also be considered to include the microphone(s) 314, as indicated in dotted line, and the microphone(s) 314 may function to receive audio inputs from the user, such as voice commands.

FIGS. 4A-D are views of internal components of an image capture device such as the image capture devices 100, 200 of FIGS. 1A-2B. The views depict the heatsink 400 having mounting flanges 402, component recesses 404A and 404B, and a cutout 412.

Figure 4A:
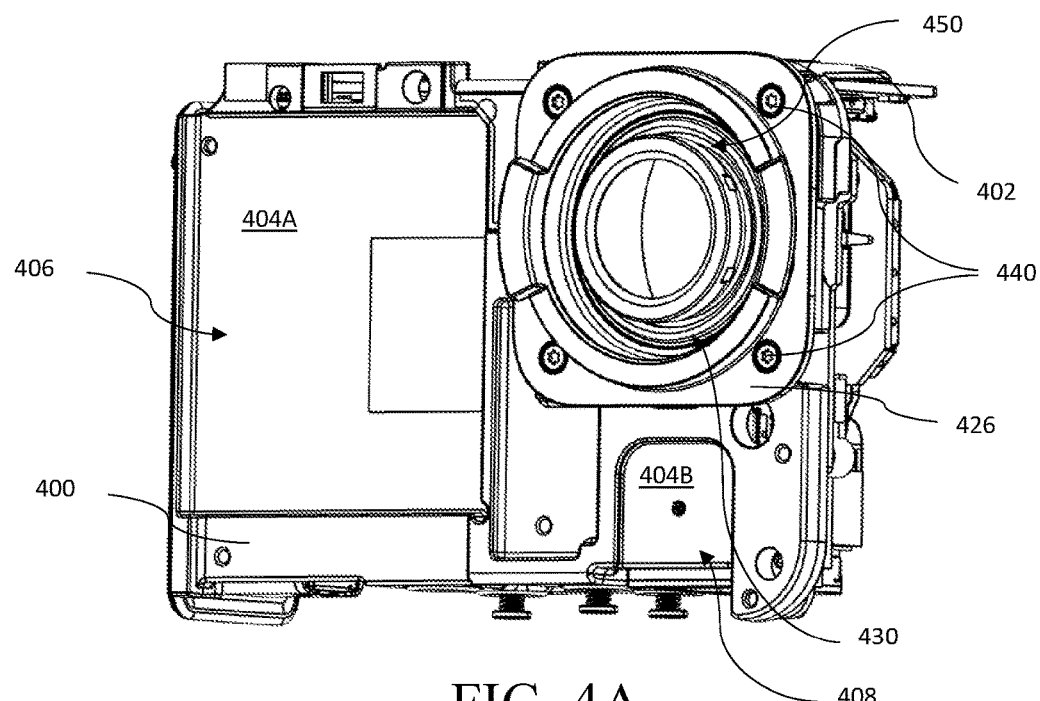
FIG. 4A is a front perspective view of a heatsink, an ISLA, and a mounting structure of an image capture device.

FIG. 4A is a front perspective view of a heatsink 400 having component recesses 404A, B. As shown, a first component recess 404A is an LCD recess 406 that may receive an LCD screen (not shown) and a second component recess 404B is a microphone membrane recess 408 that may receive a microphone, a microphone membrane, or both (not shown). A bayonet 426 extends on an outer side of the heatsink 400 and housing (not shown) so that additional lenses or lens covers (not shown) may be connected to the image capture device proximate to or covering an ISLA 430. A bayonet 426 as discussed herein is an example of one type or style of mounting structure that may be used to connect the ISLA 430, a cover lens (not shown), or both. Other types of mounting structures, such as mounting structures having threads, detents, slots, or other connection features are also possible. The bayonet 426 is connected to a housing by fasteners 440 extending from a forward side of the bayonet 426 towards a rear side of the bayonet 426. The ISLA 430 extends through the heatsink 400 and into the bayonet 426 so that a forward end 450 of the ISLA 430 is connected and stabilized by fasteners 446 (FIG. 4B) extending from the rear side of the bayonet 426 towards the forward side of the bayonet 426. The forward end 450 of the ISLA 430 is connected to the bayonet 426, which acts as a stabilization point for the ISLA 430 and combats movement of the optical axis.

The bayonet 426 is located external to the housing (not shown) and the heatsink 400 so that the ISLA 430 is connected in a forward region of the image capture device to stabilize the ISLA 430. The bayonet 426 may function to support the forward end 450 of the ISLA 430. A forward end of the ISLA 430 may extend beyond the bayonet 426. A forwardmost end of the ISLA 430 may be flush with a forward surface of the bayonet 426. A forwardmost end of the ISLA 430 may be counter sunk into the bayonet 426. The ISLA 430 may be free of direct contact with the housing (not shown), the heatsink 400, or both. The forward end 450 of the ISLA 430 may be supported only by the bayonet 426. The forward end 450, a rear end (not shown), or both ends of the ISLA 430 may be connected to the bayonet 426, the housing, the heatsink 400, or a combination thereof.

Figure 4B:
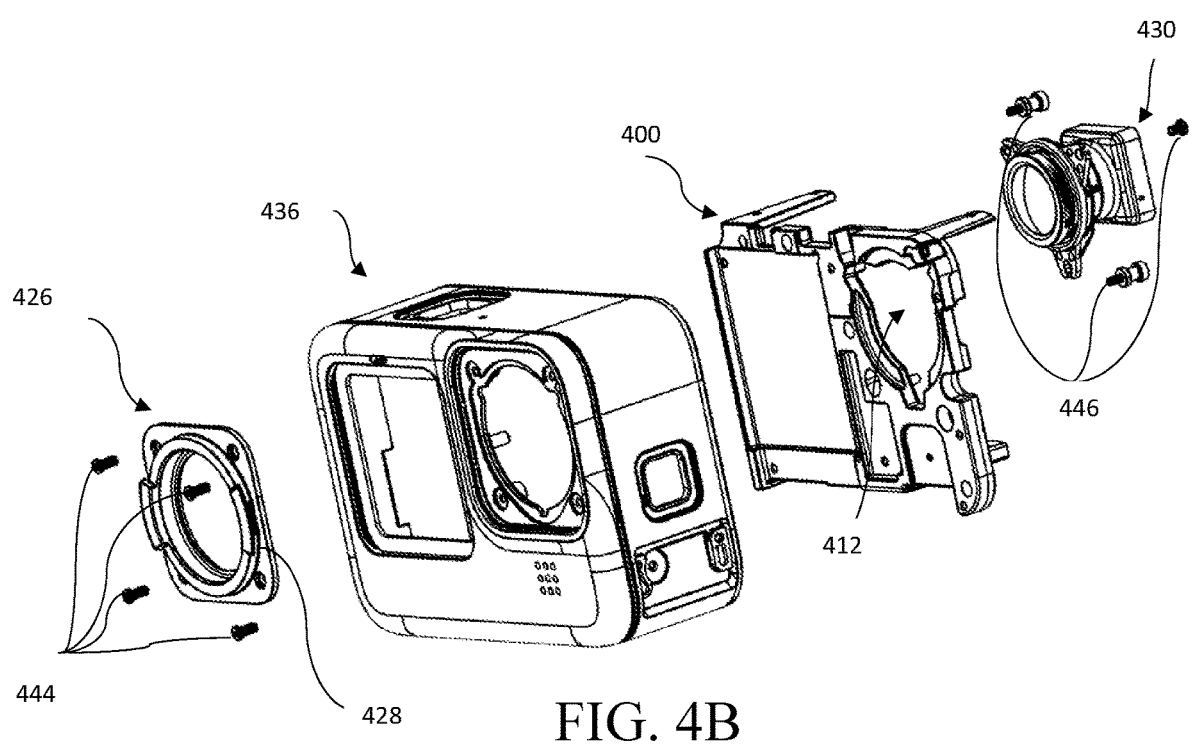
FIG. 4B is a partial exploded view of the image capture device of FIG. 1A.

FIG. 4B is a partial exploded view of an image capture device. The exploded view shows the heatsink 400 of FIG. 4A separated from the bayonet 426, the ISLA 430, and a housing 436. The ISLA 430 extends through the cutout 412 so that the ISLA 430 can directly connect to the bayonet 426 via the fasteners 446. The heatsink 400 and the housing 436 are connected via a combination of fasteners 442 (FIG. 4C) and heat stakes (not shown) so that the image capture device has supported internal components. The bayonet 426 is connected to an opposing surface of the housing 436 as the heatsink 400 by fasteners 444 so that all of the components are grounded to the housing 436 directly or indirectly. For example, the bayonet 426 and heatsink 400 may be grounded through a conductive gasket formed, for example, of silicone. In another example, the bayonet 426 may be directly connected to both the heatsink 400 and the housing 436. The bayonet 426 may only be connected to the housing 436. The bayonet 426 may be located on an external surface of the housing 436. The bayonet 426 and the heatsink 400 may be spaced apart by the housing 436 so that the bayonet is located further forward within the image capture device than the heatsink 400. In FIG. 4B, the housing 436 extends around the bayonet 426 such that a portion of the bayonet 426 is still exposed to receive different lenses, filters, or lens covers (not shown). For example, the housing 436 may cover the fasteners 444 and leave connection features 428 exposed.

Figure 4C:
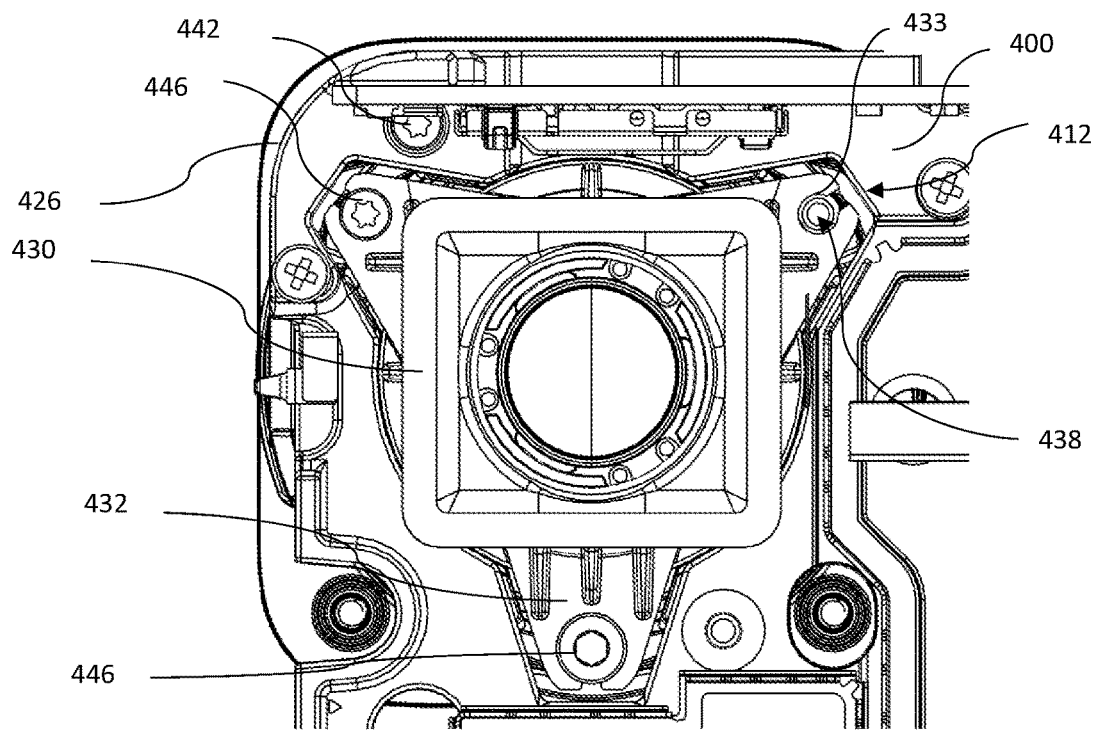
FIG. 4C is a rear view of the ISLA connected to the mounting structure and extending through the heatsink of FIGS. 4A-4B.

FIG. 4C illustrates a rear view depicting the heatsink 400 of FIGS. 4A-4B. The bayonet 426 is located on a forward side of the heatsink 400 so that the ISLA 430 extends from a rear side of the heatsink 400 through the cutout 412 and into contact with the bayonet 426. The heatsink 400 is connected to and supported by a housing (not shown) by fasteners 442 and heat stakes (not shown). The ISLA 430 includes mounting arms 432 that receive fasteners 446 to connect the ISLA to the bayonet 426. The cutout 412 may be shaped to mirror the shape of the ISLA 430, the mounting arms 432, or both. The cutout 412 is a space through the heatsink that is surrounded by heatsink material. The cutout 412 and the ISLA 430 may be complementary in shape. The fasteners 446 extend through mounting arms 432 of the ISLA 430 into the bayonet 426; however, as illustrated, one of the fasteners 446 has been removed from a boss 433 in one of the mounting arms 432 to illustrate a passage 438 through the mounting arm 432 into the bayonet 426. As shown, the mounting arms 432 may be coplanar with the cutout 412. The mounting arms 432 may each include a boss 433. The bosses 433 may receive the fasteners 446. The bosses 433 may be circular, oval, U-shaped, or C shaped. The mounting arms 432 may function to hold a front of the ISLA 430 relative to the bayonet 426.

Figure 4D:
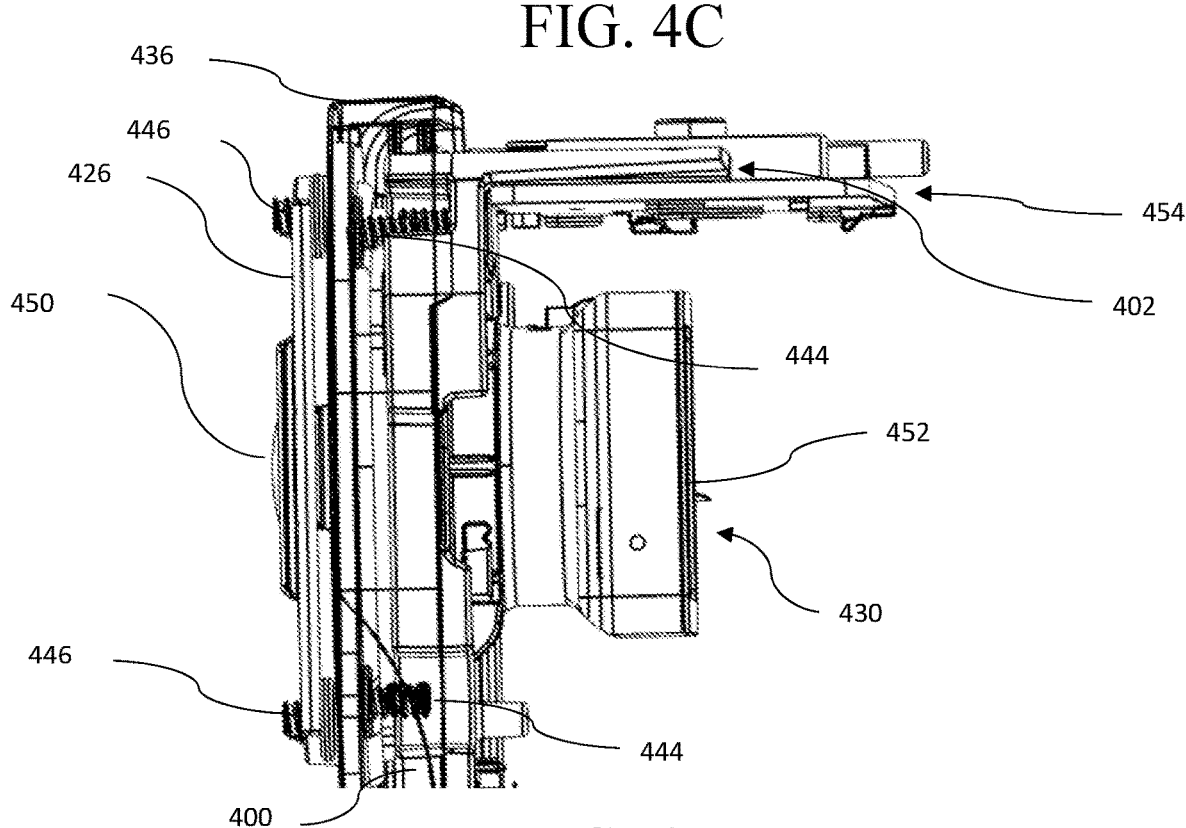
FIG. 4D is a side view of the mounting structure, the housing, the heatsink, and the ISLA of FIGS. 4A-4C.

FIG. 4D is a partial cross-sectional view illustrating the relationship of the heatsink 400, the bayonet 426, and the housing 436 of an image capture device when connected together via the fasteners 442, 444, 446. The heatsink 400 and the housing 436 are connected via fasteners 442 (FIG. 4C). The bayonet 426 is connected to the housing 436 by fasteners 444 extending from an external location with respect to the image capture device to an internal location. The bayonet 426 functions to support a forward end 450 of the ISLA 430 so that the ISLA 430 is free of movement relative to the housing 436, the heatsink 400, or both. The bayonet 426 is located proximate to a forward end 450 of the ISLA 430 (e.g., within a range between 1 mm and 7 mm or a range between 3 mm and 5 mm).

As shown in FIG. 4D, the bayonet 426 may function to align the ISLA 430 relative to the housing 436, the heatsink 400, or both so that images or videos may be captured by a user without the ISLA 430 moving relative to the housing 436. The bayonet 426 may be partially or fully located outside of the housing 436. The mounting arms 432 (FIG. 4C), the ISLA 430, or both may be free of contact with the housing 436. The fasteners 442, 444, 446 may extend from an internal location (e.g., a rear side of the heatsink 400, the housing 436, the bayonet 426, or a combination thereof) toward an external location of the image capture device. The ISLA 430 includes the forward end 450 that extends through the heatsink 400, the housing 436, and the bayonet 426, and is connected to the bayonet via the fasteners 446. A rear end 452 of the ISLA 430 extends into an internal location of the image capture device, for example, below a GPS assembly 454. The GPS assembly 454 is connected to one of the mounting flanges 402 of the heatsink 400 as shown.

Figure 5:
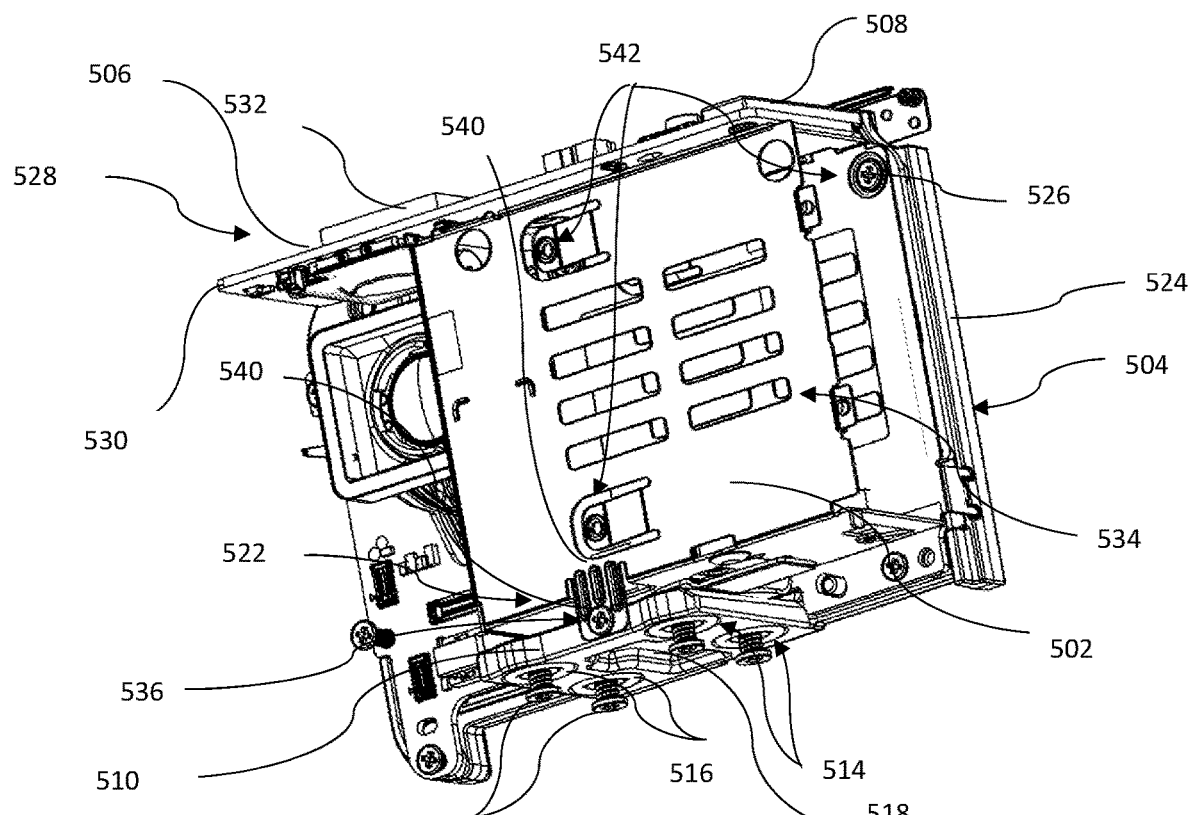
FIG. 5 is a rear perspective view of a battery cage connected to a heatsink.

FIG. 5 is a rear perspective view of a connection between a battery cage 502 and a heatsink 504. The heatsink 504 includes mounting flanges 506, 508 and a finger mounting flange 510 extending outward from the heatsink 504. The finger mounting flange 510 receives fasteners 512 that connect a housing (not shown) to the finger mounting flange 510. The finger mounting flange 510 functions to connect the heatsink 504 to a housing (not shown), connect the heatsink 504 to the battery cage 502, or both. The finger mounting flange 510 functions to assist in forming a watertight connection between the housing (FIG. 4B) and the heatsink 504. The finger mounting flange 510 includes seal recesses 514, seal members 516, and a space 518 that is located between the seal recesses 514. The finger mounting flange 510 may include the seal recesses 514.

In another example, the seal recesses 514 and the seal members 516 may be located in or on the housing. The seal recesses 514 function to partially or fully counter sink the seal members 516. Each seal recess 514 may receive one of the seal members 516. The finger mounting flange 510 may include a same number of seal members 516 and seal recesses 514. The seal members 516 and the seal recesses 514 may be located on a bottom surface of the finger mounting flange 510, between the finger mounting flange 510 and the housing (not shown), or both. For example, the finger mounting flange 510 may include two seal recesses 514 and the housing may include two seal recesses 514. The seal recesses 514, seal members 516, or both may be circular, square, rectangular, triangular, geometric, symmetrical, non-symmetrical, or a combination thereof. The seal recesses 514 may be ring recesses. The seal members 516 may be located between the housing and the finger mounting flange 510. The finger mounting flange 510 may have an area that receives one or more, two or more, three or more, or even four or more seal members 516. The space 518 may be a reduction in material from the heatsink 504 where heat is not introduced into the heatsink 504. The seal recesses 514 and seal members 516 may be located on an opposite side of the finger mounting flange 510 as the battery cage 502.

The finger mounting flange 510 is connected to the battery cage 502 by a battery connector 522. The battery cage 502 is also connected to a planar surface 524 of the heatsink 504 via a fastener 526 that extend through a cage connector 542. The battery cage 502 functions to transmit heat between a battery (not shown) and the heatsink 504, retain a battery within the image capture device, or both. The battery cage 502 may be in direct or indirect contact with the finger mounting flanges 510, the planar surface 524, or both. The battery cage 502 may be made of or include metal, plastic, a polymer, rubber, an elastomer, or a combination thereof. The battery cage 502 may be made of a metal comprising aluminum, titanium, steel, iron, or a combination thereof. The battery cage 502 may be solid or may include through holes 534. The through holes 534 may be round, square, rectangular, symmetrical, asymmetrical geometric, non-geometric, or a combination thereof. The through holes 534 may be located within a forward side, a rearward side, or both sides of the battery cage 502. A forward side of the battery cage 502 may be directly connected to a rear side of the heatsink 504. The battery cage 502 and the heatsink 504 may be connected via the fasteners 512. The battery cage 502 may have a planar surface (not shown), the heatsink 504 may have the planar surface 524, and the two planar surfaces may be in contact with each other. The battery cage 502 may be directly or indirectly connected to the finger mounting flange 510. The battery cage 502 may be connected to both the planar surface 524 and the finger mounting flange 510 of the heatsink 504. A battery connector 522 may connect the battery cage 502 to the finger mounting flange 510.

The battery connector 522 extends between the finger mounting flange 510 and the battery cage 502. The battery connector 522 functions to restrict movement of the battery cage 502 relative to the heatsink 504, to maintain contact between the battery cage 502 and the heatsink 504, or both. For example, the battery connector 522 may retain the battery cage 502 against the planar surface 524 of the heatsink 504. The battery connector 522 may be generally "L" shaped, "C" shaped, straight, curved, or a combination thereof. The battery connector 522 may be a monolithic part of or a discrete part from the battery cage 502, the finger mounting flange 510, or both. The battery connector 522 may extend downward from the battery cage 502 over a battery boss 536 in the finger mounting flange 510 so that a fastener 526 may extend through and connect the battery cage 502 to the finger mounting flange 510. The battery connector 522 may be flat, smooth, ribbed 540, include raised surfaces, or a combination thereof. The battery connector 522 may be located opposite a GPS assembly 528.

The mounting flange 508 of the heatsink 504 is connected to and supports the GPS assembly 528 so that the GPS assembly 528 is fixedly connected within the image capture device. The GPS assembly 528 includes a printed circuit board (PCB) 530 and an antenna 532. The antenna 532 is fixed near an outside of the image capture device by the mounting flange 508 of the heatsink 504 so that the antenna 532 can accurately send and receive information.

Figure 6A:
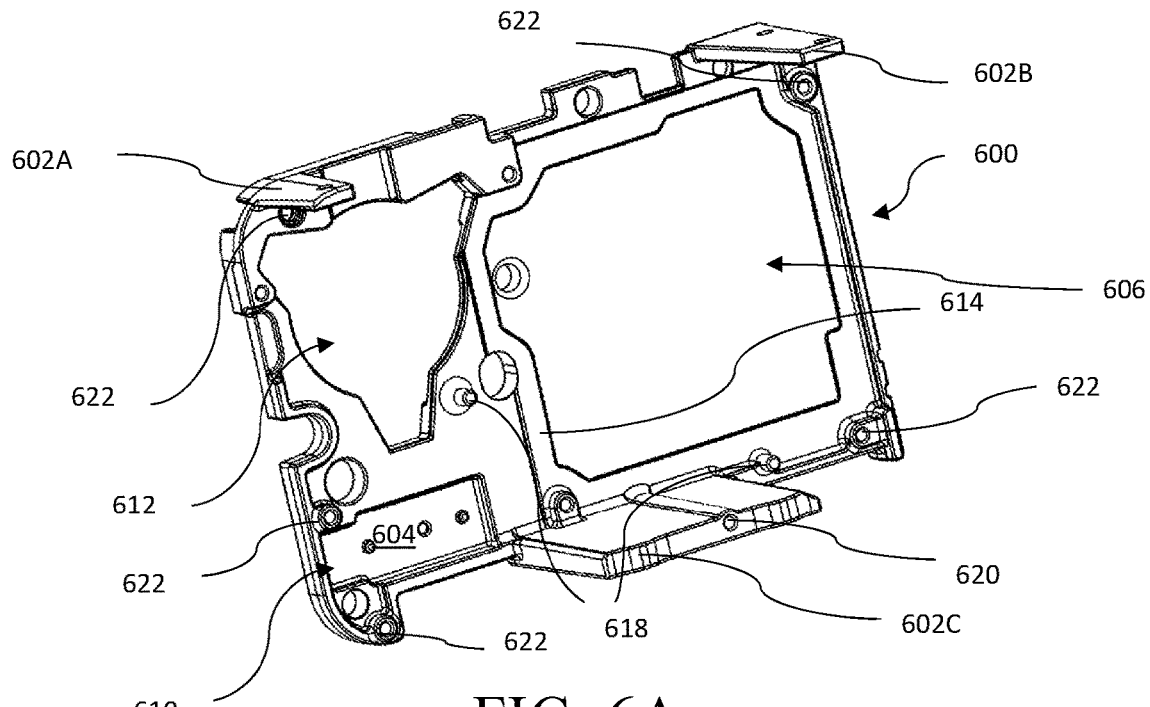
FIG. 6A is a rear perspective view of the heatsink of FIGS. 4A-4D.
Figure 6B:
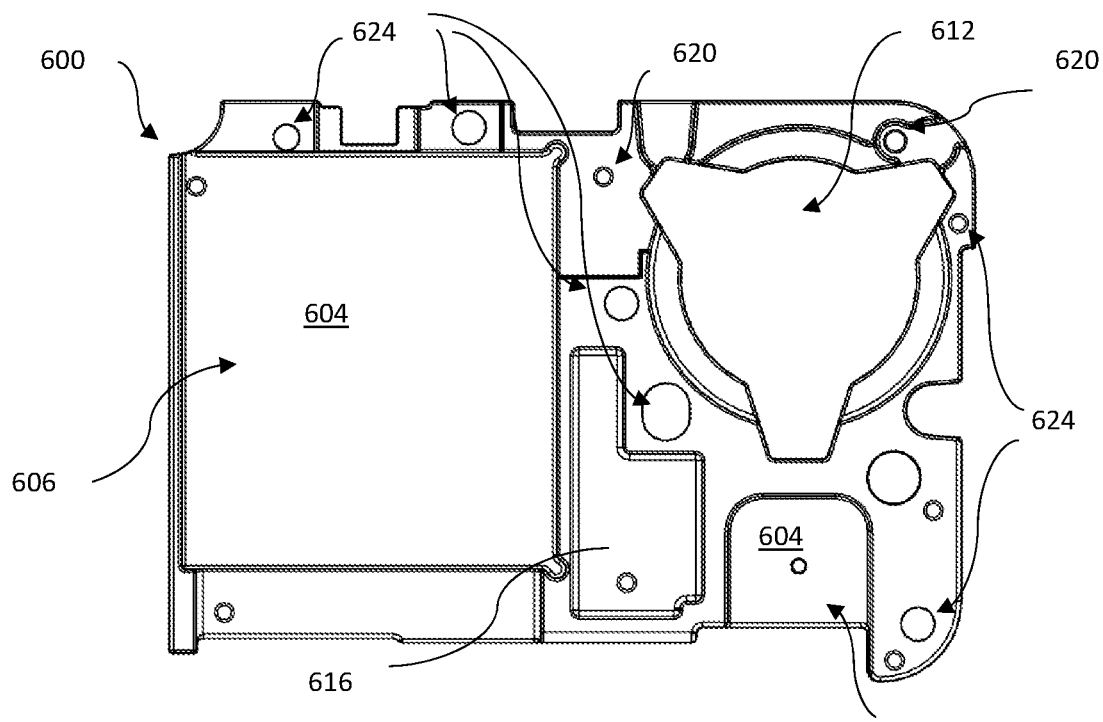
FIG. 6B is a front view of the heatsink of FIG. 6A.
Figure 6C:
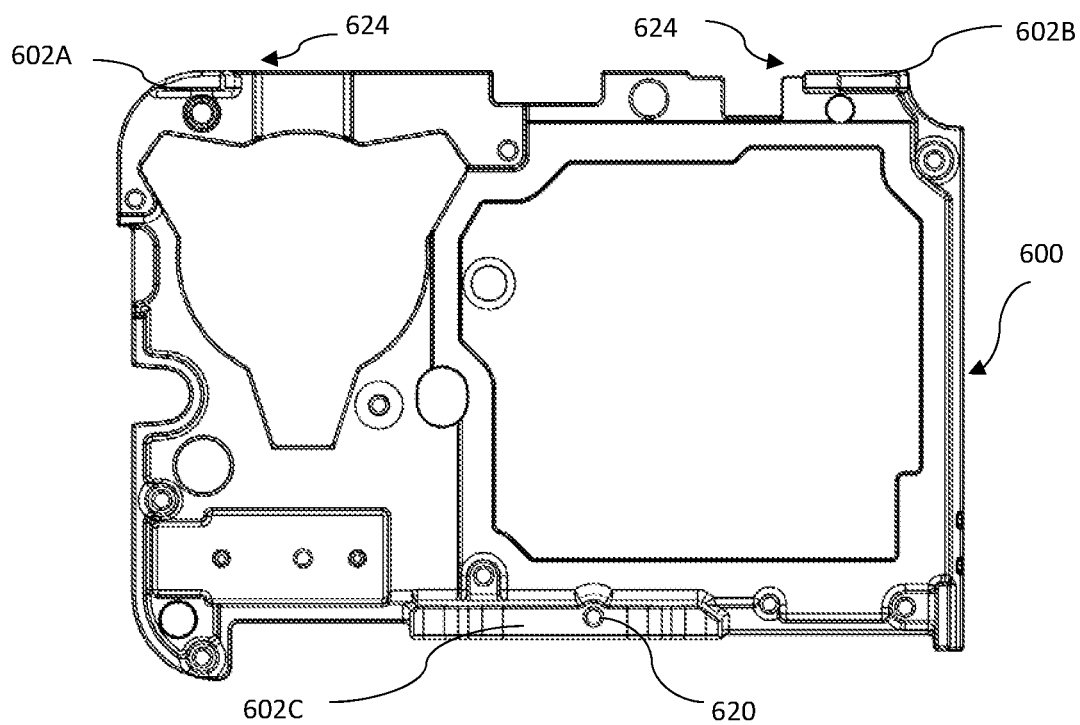
FIG. 6C is a rear view of the heatsink of FIGS. 6A-6B.

FIGS. 6A-C are various views of a heatsink 600. The heatsink 600 can be used with an image capture device such as the image capture devices 100, 200 of FIGS. 1A-2B so that thermal energy within the image capture device is distributed and moved away from components that have thermal energy. The heatsink 600 includes mounting flanges 602A, 602B, and 602C that extend outward from a body portion of the heatsink 600 to support components. The heatsink 600 includes component recesses 604 including an LCD recess 606, a microphone membrane recess 608, and a microphone recess 610 so that components located within the recesses 604, 606, 608, 610 are at least partially housed within the heatsink 600.

FIG. 6A is a rear perspective view of the heatsink 600, which functions to remove heat from components, distribute heat, redistribute heat, prevent components from becoming overheated, or to perform a combination thereof. In one example, the heatsink 600 may have a portion that is located external to a housing (not shown) of the image capture device. In another example, the heatsink 600 may have a portion that is located internal to a housing (not shown) of the image capture device. The heatsink 600 may be located entirely internal to a housing, for example, if used with the image capture devices 100, 200 of FIGS. 1A-2B. The heatsink 600 may be located entirely external to a housing (not shown). The heatsink 600 may include a body portion. The body portion of the heatsink 600 may include a planar surface that extends parallel to a forward surface, a rearward surface, or both, of the image capture device and mirrors a shape of a forward portion or a rearward portion of the image capture device. The planar surface of the heatsink 600 is connected to mounting flanges including a first mounting flange 602A, a second mounting flange 602B, and a finger mounting flange 602C that extend away from the planar surface to support other components.

The mounting flanges 602A, 602B, 602C function to support components, printed circuit boards, electrical elements, batteries, battery cages, or a combination thereof. The mounting flanges 602A, 602B, 602C function to provide a heat transfer surface, ground electrical elements (e.g., a battery or a printed circuit board), protect internal components, or a combination thereof. The mounting flanges 602A, 602B, 602C may create a partial cage around internal components of the image capture device such as a battery, a battery cage, an ISLA, or a combination thereof. The mounting flanges 602A, 602B, 602C may extend normal to a planar surface of the heatsink 600. The mounting flanges 602A, 602B, 602C may be located in an end corner region of the heatsink 600. For example, the mounting flanges 602A, 602B, 602C may be located in a top right corner, a top left corner, a bottom left corner, a bottom right corner, or a combination thereof. The mounting flanges 602A, 602B, 602C may be located in a central region of the heatsink 600. The mounting flanges 602A, 602B may be located in an upper region of the heatsink 600 and the mounting flange 602C may be located in a lower region of the heatsink 600 opposite the upper region. The mounting flanges 602A, 602B, 602C may extend from a location proximate to one or more of the component recesses 604, 606, 608, 610.

The component recesses 604, 606, 608, 610 function to receive components, partially recess a component, or both. The front side of the heatsink 600 includes the (LCD recess 606 and the microphone membrane recess 608 shown in FIG. 6B that function to remove thermal mass from the LCD (not shown) and other components in contact with the front side of the heatsink 600. The rear side of the heatsink 600 includes the microphone recess 610 shown in FIG. 6A that functions to remove thermal mass from the microphone (not shown) and other components in contact with the rear side of the heatsink 600.

FIG. 6A illustrates a shield feature 614 that extends between a first region of the heatsink 600 comprising the microphone recess 610 and the cutout 612 and a second region of the heatsink 600. As shown, the second region is located on an opposite side of the heatsink 600 as the LCD recess 606 that houses an LCD (not shown). The shield feature 614 may receive a seal or gasket (not shown) that acts as a conductive shield. The shield feature 614 may function to support a seal or gasket that prevents or limits electrical radiation from extending from a first component to a second component or a first region to a second region within the image capture device. For example, the shield feature 614 may retain a seal or gasket that prevents electrical radiation from extending from the LCD to the microphone, the ISLA, or both. The shield feature 614 may prevent some electrical radiation from extending from a region proximate to the shield feature 614. The shield feature 614 may receive or be a connection location for a gasket or some other member that prevents or limits conduction of electrical radiation. The shield feature 614 may be a raised portion of the heatsink 600, may create a recess within the heatsink 600 by creating an elevated portion of the heatsink 600, may be raised so that the seal or gasket is compressed when the image capture device is closed, or a combination thereof.

In another example, the heatsink 600 comprises locator pins 618 that extend away from the heatsink 600 and assist in locating the heatsink 600 within manufacturing equipment, installation equipment, relative to other components of the image capture device, or a combination thereof. The locator pins 618 may function to ensure proper alignment of components relative to each other so that heat is evenly distributed along the heatsink 600. For example, the locator pins 618 align a main printed circuit board (not shown) with the heatsink 600.

As illustrated, the heatsink 600 includes battery bosses 620 and connection bosses 622 that connect the heatsink 600 to other components within the image capture device. The battery bosses 620 connect the heatsink 600 to a battery cage (not shown), a battery connector (e.g., the battery connector 522 of FIG. 5), or both, and the connection bosses 622 receive fasteners to connect the heatsink 600 to a housing (not shown), a planar surface of the battery cage (not shown), a bayonet (not shown), or a combination thereof.

FIG. 6B is a front view of the heatsink 600 showing several component recesses 604. The component recesses 604 may be an absence of material or a reduction in material. For example, the heatsink 600 may be thinner at a location of the component recesses 604, create a pocket that receives a component of the image capture system, or both. The component recesses 604 may connect to a component and the component may be flush or sub-flush with a plane of the heatsink 600. The component recesses 604 may reduce an amount that a component (e.g., a microphone, an LCD, or a gasket) extends above a plane of the heatsink 600.

As shown in FIG. 6B, the heatsink 600 includes a space 616. The space 616 is located between the LCD recess 606 and the microphone membrane recess 608 so that mass of the heatsink 600 is reduced where no components are present. In the example of FIG. 6B, the space 616 is an absence of material. In other examples, the space 616 may reduce mass of the heatsink 600 or be located in a region with low thermal application. For example, the space 616 may be located in a region where heat is not introduced into the heatsink 600. The space 616 may be in a location where an opposing component (not shown) extends toward the heatsink so that the space 616 prevents contact between the opposing component and the heatsink 600. The space 616 may be free of receiving any components. The space 616 may be located on an opposite side or a same side as the mounting flange 602C (shown in FIG. 6A). The space 616 may be symmetrical; asymmetrical; square; round; oval; geometric; non-geometric; shaped to fit between recesses, cutouts, or components of the image device; or a combination thereof. The space 616 may be located on a front side, a rear side, or both sides of the heatsink 600. More than one space 616 may be located on the heatsink 600. For example, a front and a back of the heatsink 600 may each include the space 616, or the front or the back may include two or more spaces 616. The space 616 may balance mass in the heatsink 600, thermal performance of the heatsink 600, or both. The space 616 may remove mass from a location where there is less of a thermal load so that more mass may be located at an area with a greater thermal load so that a temperature of the heatsink 600 may be substantially equal from side to side or edge to edge (e.g., a left region v. a right region or a top region v. a bottom region).

FIG. 6B illustrates the battery bosses 620 as positioned to allow connection of a battery cage (not shown) to a planar surface of the heatsink 600. The battery bosses 620 are located adjacent to the cutout 612 so that the battery cage when installed does not interfere with the ISLA (not shown). The heatsink 600 includes mounting holes 624 located throughout the heatsink 600 that may be used to connect the heatsink 600 to other components of the image capture device. The mounting holes 624 may connect the heatsink 600 to a front housing, a battery cage, a microphone, a printed circuit board, an LCD, a bayonet, an ISLA, or a combination thereof.

FIG. 6C is a rear view of the heatsink 600 showing the first mounting flange 602A and the second mounting flange 602B that are positioned to support a GPS assembly (not shown). The heatsink 600 includes the finger mounting flange 602C that connects to and supports a battery cage (not shown) via a battery boss 620.

Figure 7A:
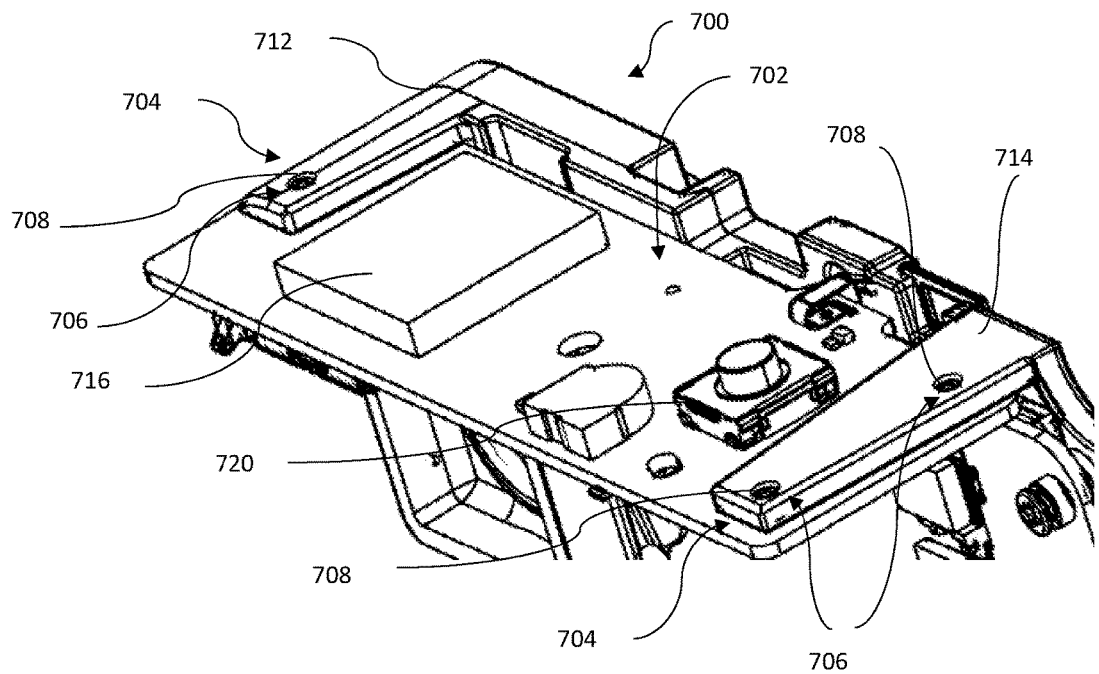
FIG. 7A is a partial top perspective view of an example of a global positioning system (GPS) printed circuit board and the heatsink of FIGS. 4A-4D.

FIG. 7A is a top perspective view of a heatsink 700 and a GPS assembly 702 for use with an image capture device such as the image capture devices 100, 200 of FIGS. 1A-2B. The GPS assembly 702 may function to correlate positioning data with an image or video at a time the image or video is taken by monitoring a position of the image capture device. The heatsink 700 includes mounting flanges 704 including flange bosses 706 that receive fasteners 708 to locate the GPS assembly 702 within an image capture device. The fasteners 708 connect a PCB 710 of the GPS assembly 702 to the flange bosses 706 located in a first mounting flange 712 and a second mounting flange 714, respectively. The PCB 710 includes an antenna 716 that is located between the first mounting flange 712 and the second mounting flange 714. The GPS assembly 702 may include the antenna 716, the PCB 710, the heatsink 700, a switch 720, a shield (not shown), or a combination thereof. The GPS assembly 702 may be located in an upper portion of the image capture device. The GPS assembly 702 may be located proximate to a housing 718 (FIG. 7B) and the heatsink 700 may orient the GPS assembly 702 relative to the housing 718. The GPS assembly 702 and the antenna 716 may be located close to the housing 718 without being in contact with the housing 718. The antenna 716 is located between the PCB 710 and the housing 718.

Figure 7B:
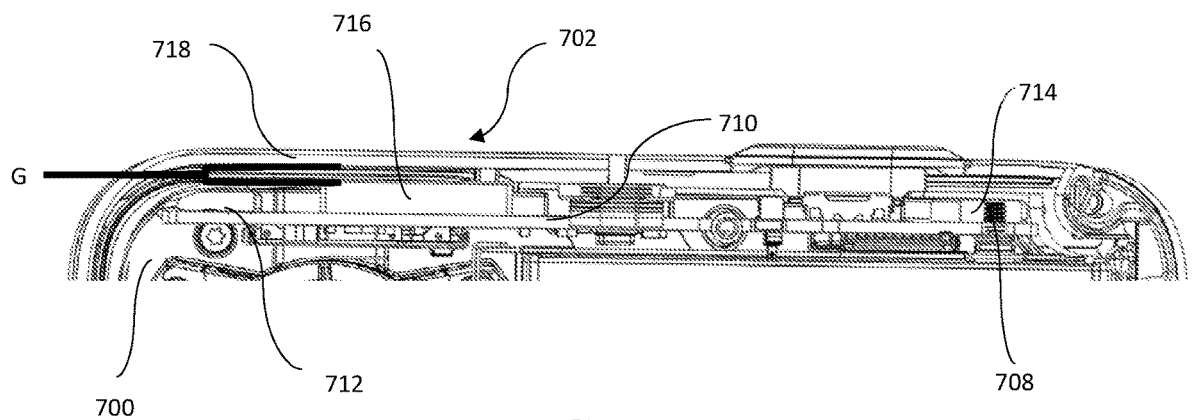
FIG. 7B is a partial cross-sectional view of an image capture device showing the GPS printed circuit board of FIG. 7A extending below the housing.

FIG. 7B is a cross-sectional view depicting the relationship between the heatsink 700, the GPS assembly 702, and the housing 718. The GPS assembly 702 is connected to the heatsink 700 at the first mounting flange 712 and the second mounting flange 714 by fasteners 708 so that the GPS assembly 702 is fixedly located within an image capture device. The antenna 716 is spaced apart from the housing 718 by a distance that represents a gap G. The gap G between the antenna 716 and the housing 718 may be sized to keep the antenna 716 and the housing 718 from contacting each other. The gap G may be sufficiently small in size such that signals to and from the antenna 716 may enter and exit the housing 718 unimpeded by the housing 718 and other componentry in the image capture device.

For example, the gap G between the housing 718 and the antenna 716 may measure about 0.01 mm or more, 0.05 mm or more, 0.1 mm or more, 0.2 mm or more, or 0.5 mm or more. The gap G between the housing 718 and the antenna 716 may be about 4 mm or less, 2 mm or less, or 1 mm or less. A thickness of the mounting flanges 712, 714 may affect a size of the gap G. The thickness of the mounting flanges 712, 714 and the antenna 716 may be substantially the same, the antenna 716 may have a thickness greater than one or both of the mounting flanges 712, 714, the antenna 716 may have a thickness less than one or both of the mounting flanges 712, 714, or a combination thereof. The antenna 716 may be located on the PCB 710 between the mounting flanges 712, 714 (e.g., the first mounting flange 712 and the second mounting flange 714). The PCB 710 of the GPS assembly 702 may be grounded by the mounting flanges 712, 714, grounded by the fasteners 708 that connect the GPS assembly 702 to the mounting flanges 712, 714, or both. The fasteners 708 may have exposed conductive material (e.g., silver or copper) that may assist in grounding the GPS assembly 702 relative to the mounting flanges 712, 714.

Figure 8A:
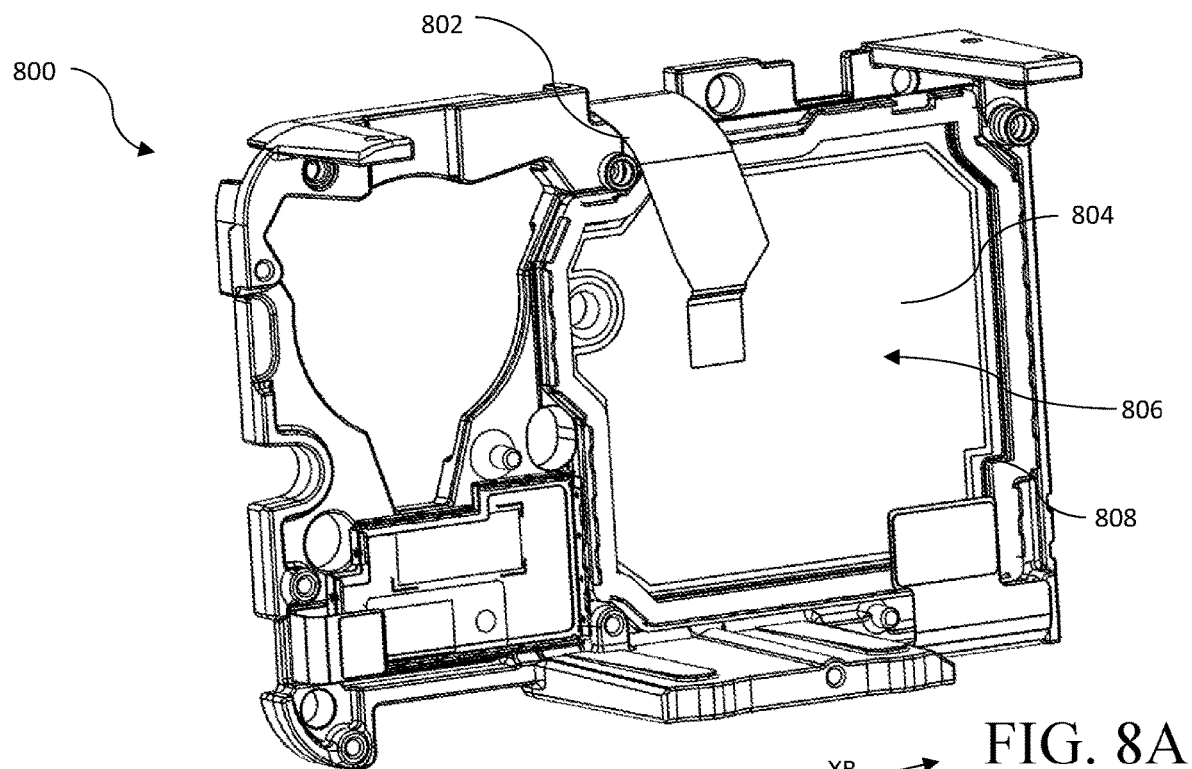
FIG. 8A is a rear isometric view of a heatsink including a sheet conductor.
Figure 8B:
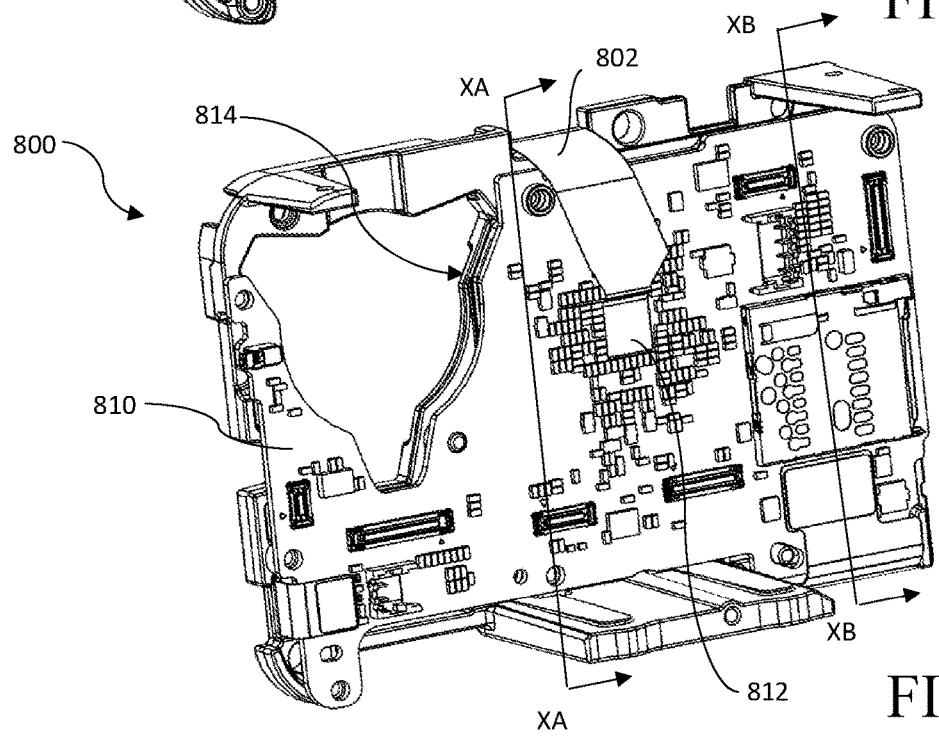
FIG. 8B is a rear isometric view of the heatsink and the sheet conductor of FIG. 8A covered by a printed circuit board.

FIGS. 8A and 8B are isometric views of a rear side of a heatsink 800. A conductor 802 is connected to the heatsink 800 and a component of the heatsink (see FIG. 8B) so that the conductor 802 assists in distributing heat about the heatsink 800. The conductor 802 as shown assists in moving heat from the component that is located on a rear side of the heatsink 800 to a front side of the heatsink 800 so that the heat may be evenly distributed across the heatsink 800 a more readily removed from the heatsink 800. The conductor 802 may be made of any material that conducts heat. The conductor 802 may be made of a pliable material, a flexible material, a thin material, a sheet of material, graphite, graphene, a metal, copper, gold, silver, nickel, a plated material (e.g., with any of the materials listed herein), or a combination thereof. The conductor 802 may be one monolithic piece of material, a braded material, a pressed material, a woven material, a flattened material, or a combination thereof. The conductor 802 may extend over or around a sheet conductor 804.

The sheet conductor 804 functions to provide additional conductance between the heatsink 800 and components. The sheet conductor 804 may be made of a same material as the conductor 802. The sheet conductor 804 may be a graphite sheet. The sheet conductor 804 may be larger than the conductor 802. The sheet conductor 804 is located proximate to a planar surface 806 of the heatsink 800. The sheet conductor 804 may be in direct contact with the planar surface 806 so that heat may be distributed to the heatsink 800 through the planar surface 806. The sheet conductor 804 may be substantially a same size as the planar surface 806. The sheet conductor 804 may assist in providing a thermal transfer between the heatsink 800 and the component creating heat. The sheet conductor 804 may have a higher thermal conductivity than the heatsink 800.

The sheet conductor 804 may have a thermal conductivity of about 500 $Wm^{-1} K^{-1}$ or more, about 700 $Wm^{-1} K^{-1}$ or more, about 900 $Wm^{-1} K^{-1}$ or more, about 1200 $Wm^{-1} K^{-1}$ or more, about 1500 $Wm^{-1} K^{-1}$ or more, or about 1700 $Wm^{-1} K^{-1}$ or more (e.g., ±5). The sheet conductor 804 may have a thermal conductivity from about 25 $Wm^{-1} K^{-1}$ to about 500 $Wm^{-1} K^{-1}$, from about 500 $Wm^{-1} K^{-1}$ to about 2000 $Wm^{-1} K^{-1}$, from about 750 $Wm^{-1} K^{-1}$ to about 1800 $Wm^{-1} K^{-1}$, from about 1000 $Wm^{-1} K^{-1}$ to about 1500 $Wm^{-1} K^{-1}$, from about 1100 $Wm^{-1} K^{-1}$ to about 1300 $Wm^{-1} K^{-1}$ (e.g., about 1300 $Wm^{-1} K^{-1}$). The sheet conductor 804 may assist in spreading heat across the heatsink 800, providing heat into the heatsink 800, or both. The sheet conductor 804 may assist in pulling heat from one or more heat-producing components and providing the heat into the heatsink 800.

The planar surface 806 is a large flat area of the heatsink 800. The planar surface 806 may be a recess, a surface that contacts an LCD (not shown), a surface opposite an LCD, a surface that contacts a battery (not shown), a surface that contacts a battery cage (not shown), a surface that contacts a microprocessor, a surface that contacts a power circuit, a surface that contacts a system on chip, a surface that contacts a power management integrated circuit, or a combination thereof. The planar surface 806 may be the component recess 604, the LCD recess 606, or both as shown in FIG. 6B. The planar surface 806 may be similarly sized to the component that the planar surface 806 is receiving a thermal transfer of energy. The planar surface 806 may be larger than the component (e.g., an LCD, power circuit, or microprocessor) that the planar surface 806 is receiving the thermal energy. The planar surface 806 may be sufficiently large to be in direct contact with one or more components, two or more components, or even three or more components. The planar surface 806, the sheet conductor 804, or both may be in communication (e.g., in direct contact with) with or bounded by a shield feature 808.

The shield feature 808 may thermally isolate and/or electrically isolate the planar surface 806, the sheet conductor 804, a component in contact with the sheet conductor 804, or a combination thereof. The shield feature 808 may prevent heat and/or electrical energy from extending from a first side of the shield feature 808 to a second side of the shield feature 808. The shield 808 may inhibit electrical interference from interfering with an LCD, power circuit, or microprocessor (not shown).

FIG. 8B illustrates the heatsink 800 and the sheet conductor 804 covered by a printed circuit board 810. The heatsink 800 and the printed circuit board 810 may be in communication (e.g., in direct contact or in indirect contact). For example, a thermal interface material may be located between the heatsink 800 and the printed circuit board 810. The printed circuit board 810 may include one or more components that generate heat while the image capture device, such as the image capture device 100 or 200 of FIG. 1 or 2, is in use. The components on the printed circuit board 810 may be one or more microprocessors, one or more power circuits, a system on chip, a power management integrated circuit, or a combination thereof. The printed circuit board 810 extends along a first side (e.g., rear side) of the sheet conductor 804 (not shown in FIG. 8B) and the heatsink 800 extends along a second side (e.g., front side) of the sheet conductor 804. The conductor 802 is connected to the printed circuit board 810 and assists in distributing and/or removing heat from the printed circuit board 810. The conductor 802 extends from a rear side 812 of the printed circuit board 810 over the printed circuit board 810, the planar surface 806, the heatsink 800, and connects to a front side 814 of the heatsink 800. The conductor 802 allows heat generated by the printed circuit board 810 or components on the printed circuit board to be moved to front side 814 of the heatsink 800 so that the heatsink 800 dissipates the heat or evenly distributes the heat. The conductor 802 balances heat within the system by moving heat from a location within the system that has a high-level of heat and moving the heat to a location with a lower level of heat. This balancing of heat permits the system to operate longer before a thermal shut off, operating without a thermal shut off, or both.

Figure 9:
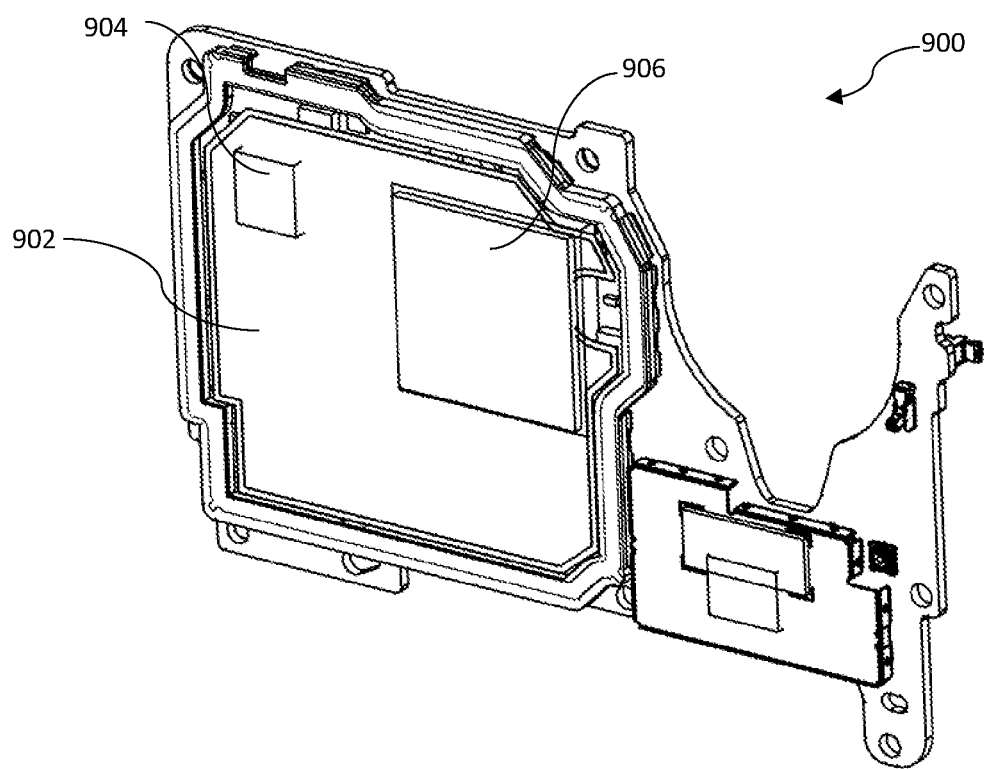
FIG. 9 is a front view of the printed circuit board of FIG. 8B.

FIG. 9 is a front view of a printed circuit board 900. The printed circuit board 900 can be similar to the printed circuit board 810. A sheet conductor 902 is in communication with the printed circuit board 900 and/or components on the printed circuit board to assist in removing heat from the printed circuit board 900. The printed circuit board 900 may include components such as a power circuit 904 and a microprocessor 906. The power circuit 904 and the microprocessor 906 are located on the printed circuit board 900 and are in communication (e.g., in direct contact with or in indirect contact with) with the sheet conductor 902. The power circuit 904, the microprocessor 906, or both may be in direct contact with the sheet conductor 902. The sheet conductor 902 provides heat dissipation directly to the power circuit 904 and microprocessor 906 so that heat is rapidly removed from both components. The quick heat dissipation allows the power circuit 904, the microprocessor 906, or both to operate without thermal issues or to operate longer without shutting down due to thermal issues.

The power circuit 904 may perform a DC to DC conversion, battery charging, voltage scaling, power sequencing, or a combination thereof. The power circuit 904 may produce heat while the image capture device that includes the printed circuit board 900, such as the image device 100 or 200 of FIG. 1 or 2, is being used. The power circuit 904 may be a power management integrated circuit (PMIC). The power circuit 904 may work in conjunction with the microprocessor 906.

The microprocessor 906 may control the image capture device, store images, store instructions, control one or more sensors, or a combination thereof. The microprocessor 906 may include memory. The microprocessor 906 may be a system on chip (SOC). The microprocessor 906 may produce heat when the microprocessor 906 is operating.

Figure 10A:
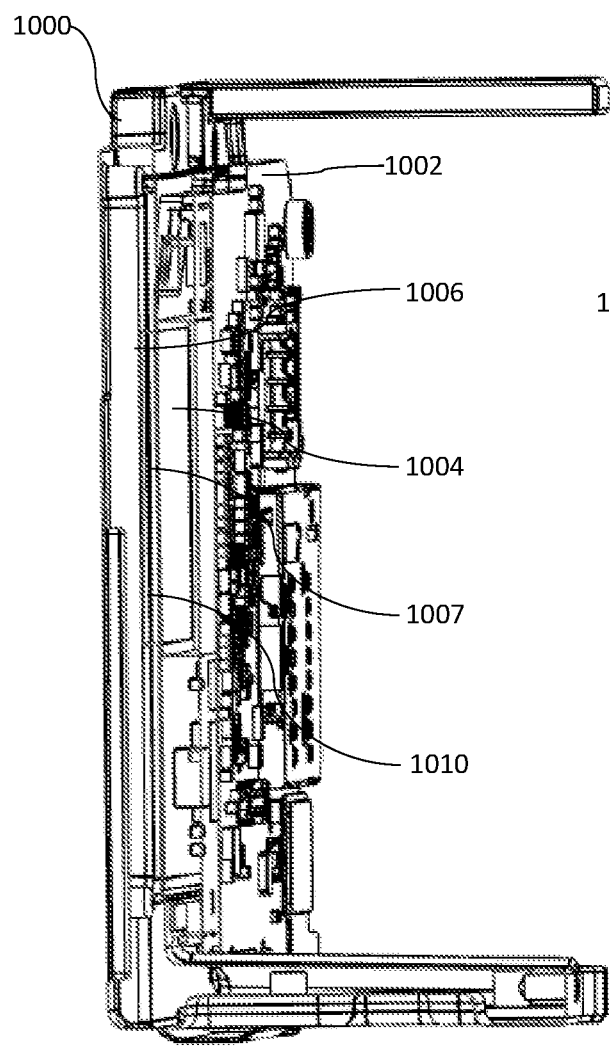
FIG. 10A is a cross-sectional view of the heatsink, sheet conductor, and printed circuit board of FIG. 8B along line XA-XA.

FIG. 10A is a cross-sectional view of the heatsink 800 of FIG. 8B along lines XA-XA referring to the heatsink 1000 for clarity. The heatsink 1000 is connected to a printed circuit board 1002. The printed circuit board 1002 has a microprocessor 1004 that is in communication with a sheet conductor 1006. The sheet conductor 1006 is sandwiched between a microprocessor 1004 and the heatsink 1000 to facilitate heat transfer from the microprocessor 1004 into the heatsink 1000. As shown, the sheet conductor 1006 is in indirect contact with the microprocessor 1004 on a first side and the heatsink 1000 on a second side.

The sheet conductor 1006 has a thickness that is less than a thickness of the heatsink 1000. The sheet conductor 1006 may have a thickness or about 5 µm, about 10 µm or more, or about 15 µm or more. The sheet conductor 1006 may have a thickness of about 1000 µm or less, about 750 µm or less, about 500 µm or less, about 250 µm or less, about 100 µm or less, about 50 µm or less, or about 25 µm or less. The sheet conductor 1006 is connected to the heatsink 1000 by a connector 1007.

The connector 1007 may be a chemical connection, a mechanical connection, or a combination of both. The connector 1007 may be an adhesive, glue, tape, double sided tape, a conductive adhesive, a sheet of adhesive, a porous adhesive, a porous tape, or a combination thereof. The connector 1007 may extend around a periphery of a planar surface of the heatsink 1000, the sheet conductor 1006, or both. The connector 1007 may cover an entire surface of the planar surface of the heatsink 1000, the sheet conductor 1006, or both. The connector 1007 may conduct thermal transfer between the sheet conductor 1006 and the heatsink 1000. The connector 1007 may connect the microprocessor 1004 to the sheet conductor 1006. The sheet conductor 1006 may be in direct contact but free of physical attachment to the microprocessor 1004. The sheet conductor 1006 may be in contact with a thermal interface material 1010 and the thermal interface material 1010 may be in indirect or direct contact with the microprocessor 1004.

Figure 10B:
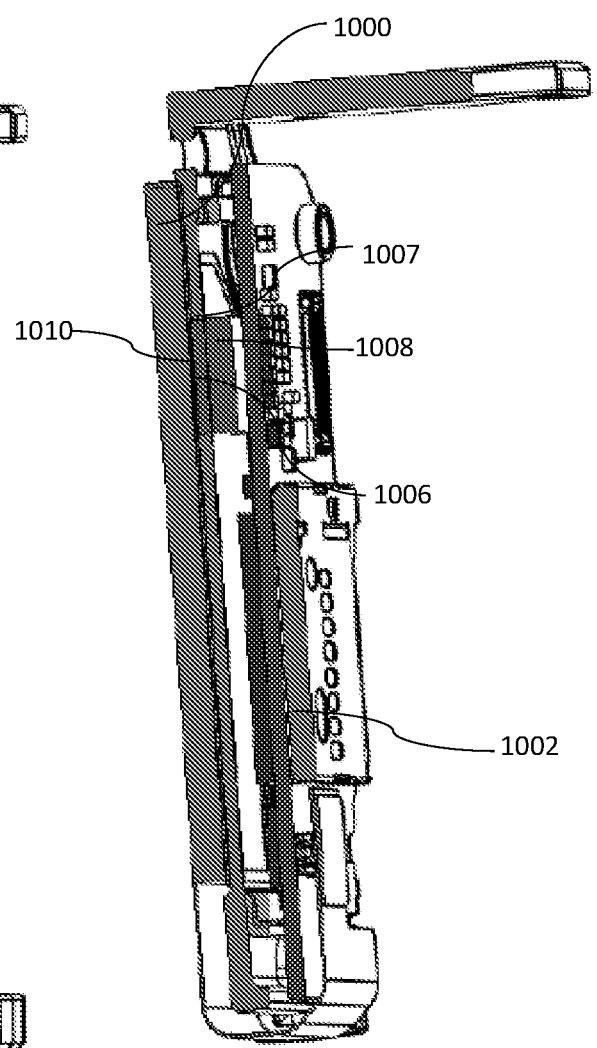
FIG. 10B is a cross-sectional view illustrating an interface with the sheet conductor of FIG. 8B along line XB-XB.
Figure 10C:
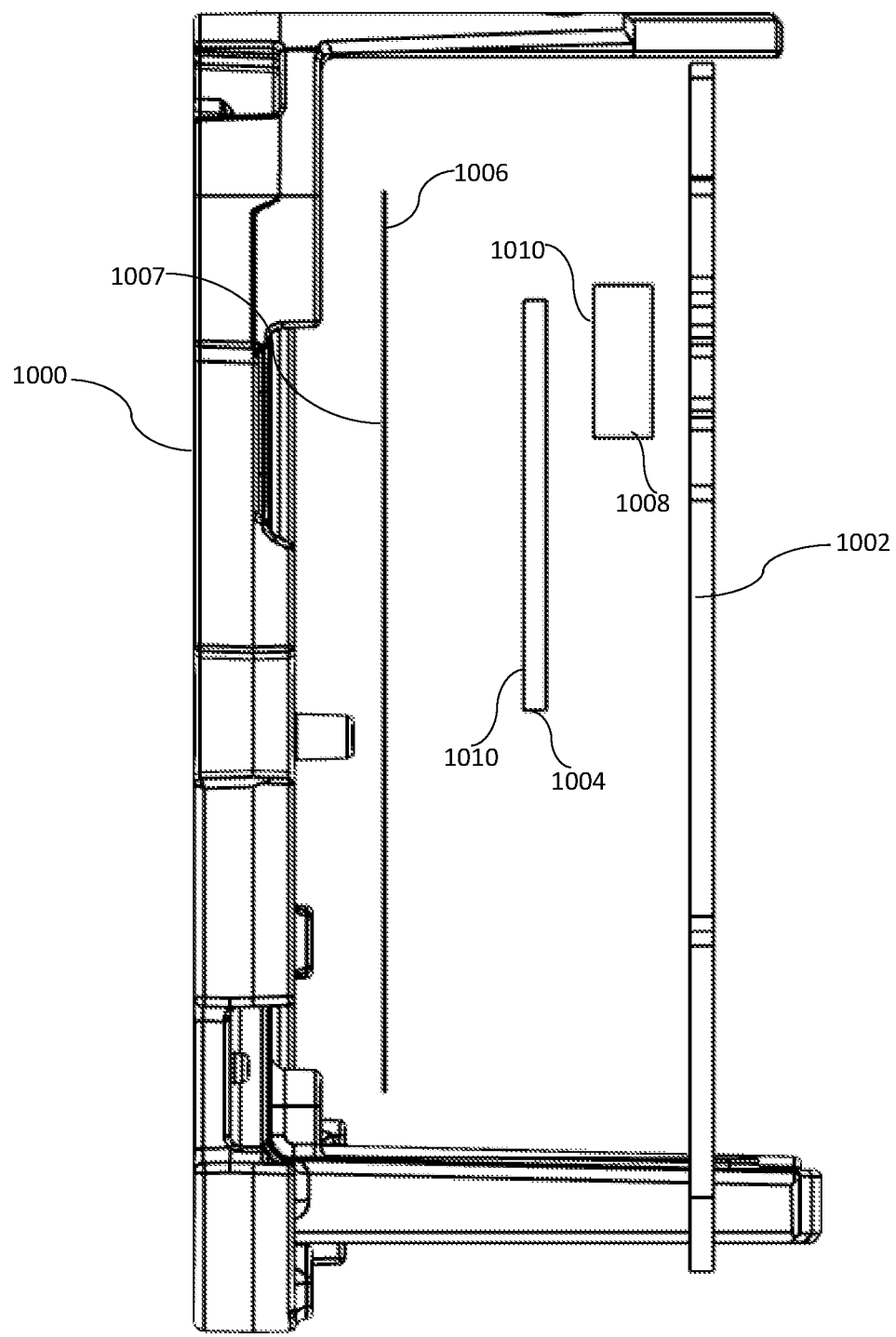
FIG. 10C is an exploded view of the components of FIGS. 10A-10B.

FIG. 10B illustrates the sheet conductor 1006 of FIG. 10A in direct contact with the heatsink 1000 and a power circuit 1008 located on the printed circuit board 1002. The sheet conductor 1006 is connected to the heatsink 1000 by the connector 1007 so that contact between the sheet conductor 1006 and heatsink 1000 is maintained. The sheet conductor 1006 facilitates heat transfer from the power circuit 1008 into the heatsink 1000. The sheet conductor 1006 may be in direct contact but free of physical attachment to the power circuit 1008. The heatsink 1000 assists in removing heat, extending operating time, distributing heat, or a combination thereof. The heatsink 1000 may assist in extending a running time of an image capture device such as the image capture device 100 or 200 of FIGS. 1 and 2, in addition to supporting avoidance of shutdown due to high temperatures. FIG. 10C is an exploded side view illustrating a stack up of the components. The heatsink 1000 is connected to the sheet conductor 1006 via a connector 1007. The printed circuit board 1002 is connected to the microprocessor 1004 and the power circuit 1008. The microprocessor 1004 and the power circuit 1008 both include a thermal interface material 1010. The thermal interface material 1010 contacts the sheet conductor 1006 so that heat is transferred from the microprocessor 1004 and the power circuit 1008 into the heatsink 1000.

The thermal interface material 1010 may be any material that assists in heat transfer from the microprocessor 1004, the power circuit 1008, or both into the sheet conductor 1006 and the heatsink 1000. The thermal interface material 1010 may be an adhesive or include an adhesive that connects the thermal interface material 1010 to a component. A connector 1007 may be attached to one or both sides of the thermal interface material 1010 to connect the thermal interface material to components. Thermal interface material 1010 may have a thermal conductivity of about 1 $Wm^{-1} K^{-1}$ or more, about 5 $Wm^{-1} K^{-1}$ or more, or about 10 $Wm^{-1} K^{-1}$ or more. Thermal interface material 1010 may have a thermal conductivity of about 100 $Wm^{-1} K^{-1}$ or less, about 50 $Wm^{-1} K^{-1}$ or less, or about 25 $Wm^{-1} K^{-1}$ or less.

While the disclosure has been described in connection with certain embodiments, it is to be understood that the disclosure is not to be limited to the disclosed embodiments but, on the contrary, is intended to cover various modifications and equivalent arrangements included within the scope of the appended claims, which scope is to be accorded the broadest interpretation so as to encompass all such modifications and equivalent structures as is permitted under the law.

What is claimed is:

1. An image capture device comprising:
   a housing;
   a battery cage;
   an integrated sensor and lens assembly;
   a heatsink located partially or completely within the housing, wherein the heatsink comprises:
      a cutout through which a portion of the integrated sensor and lens assembly extends;
      a planar surface located adjacent to the cutout, wherein the planar surface comprises a front side and a rear side;
      bosses configured to receive fasteners that connect a component to the heatsink;
      a first mounting flange extending from a top of the heatsink; and
      a finger mounting flange extending from a bottom of the heatsink;
   a printed circuit board in communication with the rear side of the planar surface of the heatsink, wherein the printed circuit board and the battery cage are located between the first mounting flange and the finger mounting flange, and wherein the printed circuit board and the heatsink are connected together via one or more of the bosses; and
   a liquid crystal display (LCD) recess located in the front side of the planar surface of the heatsink that is configured to receive a liquid crystal display (LCD), wherein the LCD recess is opposite the printed circuit board.

2. The image capture device of claim 1, wherein a power circuit, a microprocessor, or both are located on the printed circuit board.

3. The image capture device of claim 1, further comprising:
   a thermal interface material located between the printed circuit board and the rear side of the planar surface to thermally connect the printed circuit board to the planar surface.

4. The image capture device of claim 3, wherein a thermal conductivity of the thermal interface material is between 1 Wm$^{-1}$ K$^{-1}$ to 100 Wm$^{-1}$ K$^{-1}$.

5. The image capture device of claim 1, wherein the printed circuit board is located between the heatsink and the battery cage.

6. The image capture device of claim 5, wherein the battery cage includes through holes.

7. The image capture device of claim 1, wherein the heatsink is made of aluminum.

8. The image capture device of claim 1, wherein the printed circuit board is located between the heatsink and the battery cage and the printed circuit board is in direct contact with the heatsink.

9. An image capture device comprising:
an integrated sensor and lens assembly;
a battery cage;
a heatsink comprising:
a planar surface comprising:
a first side facing external to the image capture device, and
a second side facing internal to the image capture device;
a cutout that is adjacent to the planar surface, wherein a portion of the integrated sensor and lens assembly is located on a first side of the heatsink, the integrated sensor and lens assembly extends through the cutout, and a portion of the integrated sensor and lens assembly is located on a second side of the heatsink;
first mounting flanges extending from a top of the heatsink;
finger mounting flanges extending from a bottom of the heatsink opposite the first mounting flanges so that the battery cage is extendable between the first mounting flanges and the finger mounting flanges; and
bosses configured to receive fasteners that form a connection with the heatsink; and
a liquid crystal display (LCD) recess, on the first side of the planar surface, that is configured to connect to a liquid crystal display (LCD) of the image capture device; and
a printed circuit board in communication with the second side of the planar surface.

10. The image capture device of claim 9, further comprising:
a thermal interface material located between the printed circuit board and a rear side of the planar surface to thermally connect the printed circuit board to the planar surface.

11. The image capture device of claim 10, wherein the printed circuit board is located between the heatsink and the battery cage.

12. The image capture device of claim 9, wherein the cutout is a space through the heatsink that is surrounded by heatsink material.

13. The image capture device of claim 9, wherein the printed circuit board comprises a microprocessor, a power circuit, or both.

14. The image capture device of claim 9, wherein the LCD recess is a reduction in material that creates a pocket to receive a portion of the LCD.

15. An image capture device comprising:
a housing;
a heatsink located partially or completely within the housing, wherein the heatsink comprises:
a planar surface,
a cutout configured to receive an integrated sensor and lens assembly,
a first mounting flange connected to a first edge of the heatsink,
a finger mounting flange connected to a second edge of the heatsink with the planar surface extending between the first mounting flange and the finger mounting flange; and
bosses configured to receive fasteners that connect a component to the heatsink;
a thermal interface material;
a battery cage;
a liquid crystal display (LCD) recess, on a first side of the planar surface; and
a printed circuit board in communication with the planar surface of the heatsink via the thermal interface material, wherein the battery cage and the printed circuit board are located between the first mounting flange and the finger mounting flange.

16. The image capture device of claim 15, further comprising:
a liquid crystal display (LCD) that is in communication with the planar surface on a side of the heatsink opposite the printed circuit board.

17. The image capture device of claim 15, wherein the heatsink is located completely within the housing.

18. The image capture device of claim 15, further comprising:
a component recess disposed below the cutout and on an opposite side of the heatsink as the first mounting flange and the finger mounting flange.

19. The image capture device of claim 15, further comprising:
a shield feature extending between the printed circuit board and the planar surface of the heatsink.

20. The image capture device of claim 19, wherein the shield feature extends around a periphery of the planar surface.

* * * * *